US012703475B2

(12) United States Patent
DiVerde et al.

(10) Patent No.: US 12,703,475 B2
(45) Date of Patent: Aug. 11, 2026

(54) SYSTEM FOR ATTACHING HEAT GENERATING EQUIPMENT TO AN EXTERIOR OF AN AIRCRAFT

(71) Applicant: The Boeing Company, Arlington, VA (US)

(72) Inventors: Michael B. DiVerde, Granite Falls, WA (US); Timothy Allen Caviness, Kent, WA (US); Jared J. Lucero, Everett, WA (US); Steven J. Avila, Renton, WA (US); Ryan Kevin Torgerson, Kalispell, MT (US)

(73) Assignee: The Boeing Company, Arlington, VA (US)

( * ) Notice: Subject to any disclaimer, the term of this patent is extended or adjusted under 35 U.S.C. 154(b) by 275 days.

(21) Appl. No.: 18/358,826

(22) Filed: Jul. 25, 2023

(65) Prior Publication Data

US 2025/0033755 A1 Jan. 30, 2025

(51) Int. Cl.

| | |
|---|---|
| ***H05K 5/03*** | (2006.01) |
| ***B64C 1/36*** | (2006.01) |
| ***B64C 1/40*** | (2006.01) |
| ***H01Q 1/02*** | (2006.01) |

(52) U.S. Cl.

CPC .................. *B64C 1/36* (2013.01); *B64C 1/40* (2013.01); *H01Q 1/02* (2013.01); *H05K 5/03* (2013.01)

(58) Field of Classification Search

CPC ... B64C 1/36; B64C 1/40; H01Q 1/02; H01Q 1/286; H01Q 1/42; H05K 5/0213; H05K 5/03

See application file for complete search history.

(56) References Cited

U.S. PATENT DOCUMENTS

| | | | | |
|---|---|---|---|---|
| 10,193,218 | B2 | 1/2019 | Baron et al. | |
| 2006/0250311 | A1* | 11/2006 | Bishop | H01Q 21/28 343/702 |
| 2007/0171609 | A1* | 7/2007 | Kehl | H05K 7/20181 361/690 |
| 2011/0116230 | A1* | 5/2011 | Kwak | H01Q 1/42 361/688 |
| 2017/0271745 | A1 | 9/2017 | Yun et al. | |

(Continued)

FOREIGN PATENT DOCUMENTS

| | | | |
|---|---|---|---|
| CA | 3212266 | A1 | 9/2022 |
| EP | 2790267 | A1 | 10/2014 |
| JP | 2013201774 | A * | 10/2013 |

OTHER PUBLICATIONS

Translation of Nomura JP-2013201774-A (Year: 2013).*

(Continued)

*Primary Examiner* — Jacob R Crum
(74) *Attorney, Agent, or Firm* — Yee & Associates, P.C.

(57) ABSTRACT

A mounting system for attaching heat generating equipment to an exterior of an aircraft. The mounting system comprises an adapter plate connected to a fuselage of the aircraft; a layer of insulation substantially covering a first face of the adapter plate; a subplate formed of a conductive material and connected to the adapter plate such that the layer of insulation is positioned between the subplate and the adapter plate; heat generating equipment secured within the subplate; and a radome connected to the adapter plate and positioned to cover the heat generating equipment and the subplate.

20 Claims, 18 Drawing Sheets

(56) References Cited

U.S. PATENT DOCUMENTS

| | | | | |
|---|---|---|---|---|
| 2017/0373383 | A1 | 12/2017 | Baron et al. | |
| 2018/0108978 | A1* | 4/2018 | Gonsowski .............. | H01Q 1/42 |
| 2019/0305408 | A1* | 10/2019 | Chao ...................... | H01Q 1/286 |
| 2023/0331368 | A1* | 10/2023 | Garnault ................ | B64D 45/02 |
| 2024/0120634 | A1* | 4/2024 | Mochizuki ............... | H01Q 1/02 |

OTHER PUBLICATIONS

Diverde et al., "System for Attaching Heat Generating Equipment to an Exterior of an Aircraft," filed Jul. 25, 2023, U.S. Appl. No. 18/358,776, 59 pages.
Extended European Search Report, dated Feb. 1, 2025, regarding EP Application No. 24187799.2, 9 pages.
Office Action, dated Apr. 25, 2025, regarding U.S. Appl. No. 18/358,776, 20 pages.
Notice of Allowance, dated May 30, 2025, regarding U.S. Appl. No. 18/358,776, 10 pages.

* cited by examiner

SYSTEM FOR ATTACHING HEAT GENERATING EQUIPMENT TO AN EXTERIOR OF AN AIRCRAFT

BACKGROUND INFORMATION

1. Field

The present disclosure relates generally to aircraft, and more specifically to attaching heat generating equipment to an exterior of an aircraft.

2. Background

Antennas are present on aircraft for at least one of navigation and communication. Aircraft also utilize several types of sensors for detecting temperature, airflow, vibration, position, force, pressure, or any other desirable characteristic. Adding antennas or sensors or utilizing new technologies for antennas and sensors can generate additional heat.

Therefore, it would be desirable to have a method and apparatus that takes into account at least some of the issues discussed above, as well as other possible issues.

SUMMARY

An embodiment of the present disclosure provides a mounting system for attaching heat generating equipment to an exterior of an aircraft. The mounting system comprises an adapter plate connected to a fuselage of the aircraft; a layer of insulation substantially covering a first face of the adapter plate; a subplate formed of a conductive material and connected to the adapter plate such that the layer of insulation is positioned between the subplate and the adapter plate; heat generating equipment secured within the subplate; and a radome connected to the adapter plate and positioned to cover the heat generating equipment and the subplate.

A further embodiment of the present disclosure provides a method of attaching heat generating equipment to an exterior of an aircraft. A layer of insulation is positioned between the heat generating equipment and a skin of a fuselage of the aircraft. A radome is secured over the layer of insulation and the heat generating equipment.

Another embodiment of the present disclosure provides a method of retrofitting a radome for covering heat generating equipment on an aircraft. A heat transfer portal is cut into the radome. A heat transfer door is secured within the heat transfer portal, wherein the heat transfer door comprises a metallic material and a plurality of perforations through the metallic material.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
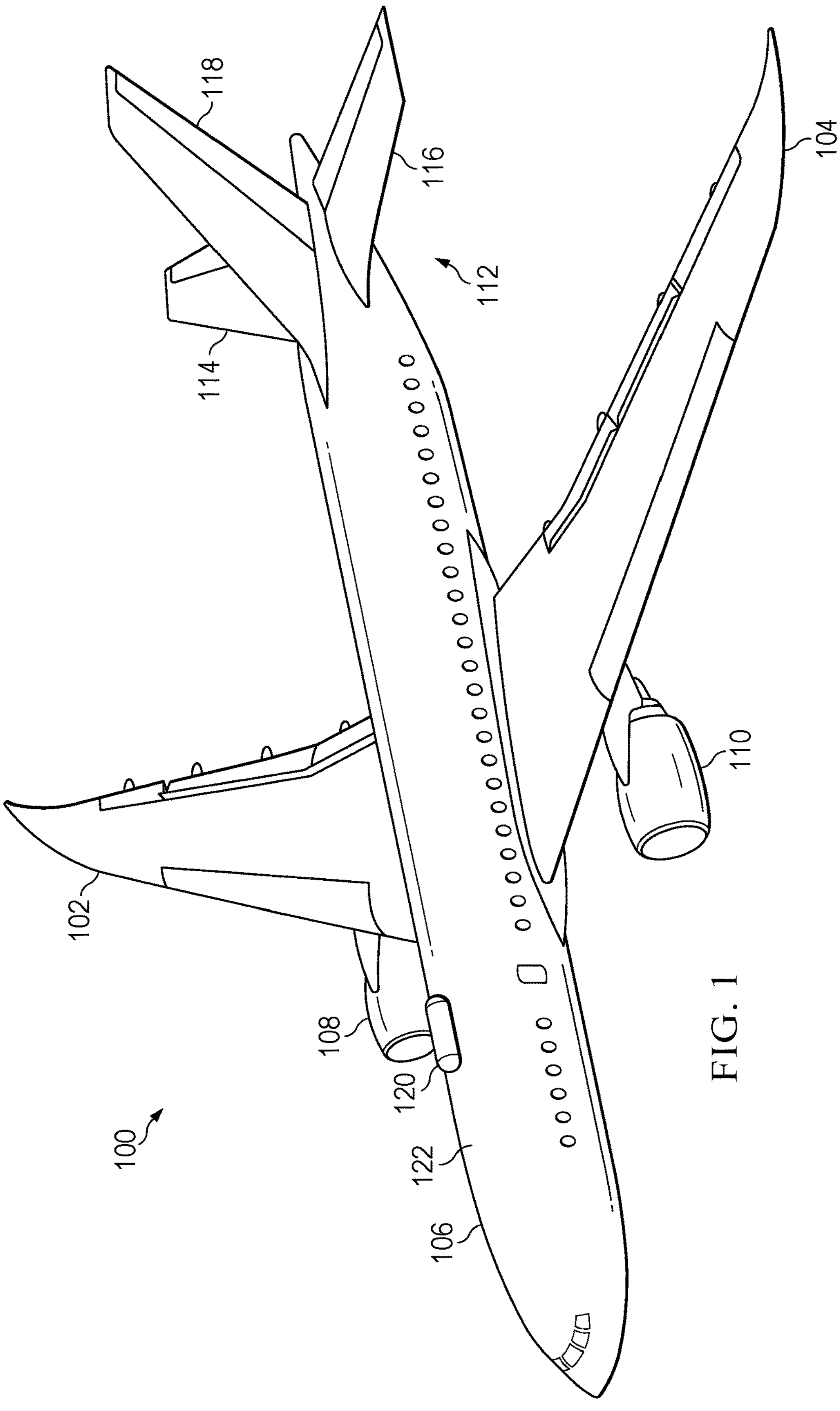
FIG. 1 is an illustration of an aircraft in accordance with an illustrative embodiment.

Turning now to FIG. 1, an illustration of an aircraft is depicted in accordance with an illustrative embodiment. Aircraft 100 has wing 102 and wing 104 attached to body 106. Aircraft 100 includes engine 108 attached to wing 102 and engine 110 attached to wing 104.

Body 106 has tail section 112. Horizontal stabilizer 114, horizontal stabilizer 116, and vertical stabilizer 118 are attached to tail section 112 of body 106.

Aircraft 100 is an example of an aircraft that can have heat generating equipment mounted to body 106 according to the illustrative examples. For example, mounting system 120 can be a physical implementation of a mounting system with heat generating equipment. The illustrative examples can be used to mount electronic antennas or any other desirable type of heat generating equipment to body 106 of aircraft 100.

Skin 122 of aircraft 100 has an upper temperature threshold. Depending upon the environmental temperature, environmental conditions, paint and other surface treatments on skin 122, and operational conditions for the heat generating equipment, it can be possible to reach undesirably high temperatures, and possibly the upper temperature threshold. The illustrative examples provide a mounting system, mounting system 120, that reduces the heat transferred to skin 122 of aircraft 100 from the heat generating equipment. Mounting system 120 stops skin 122 from reaching the upper temperature limit due to the heat generating equipment.

Figure 2:
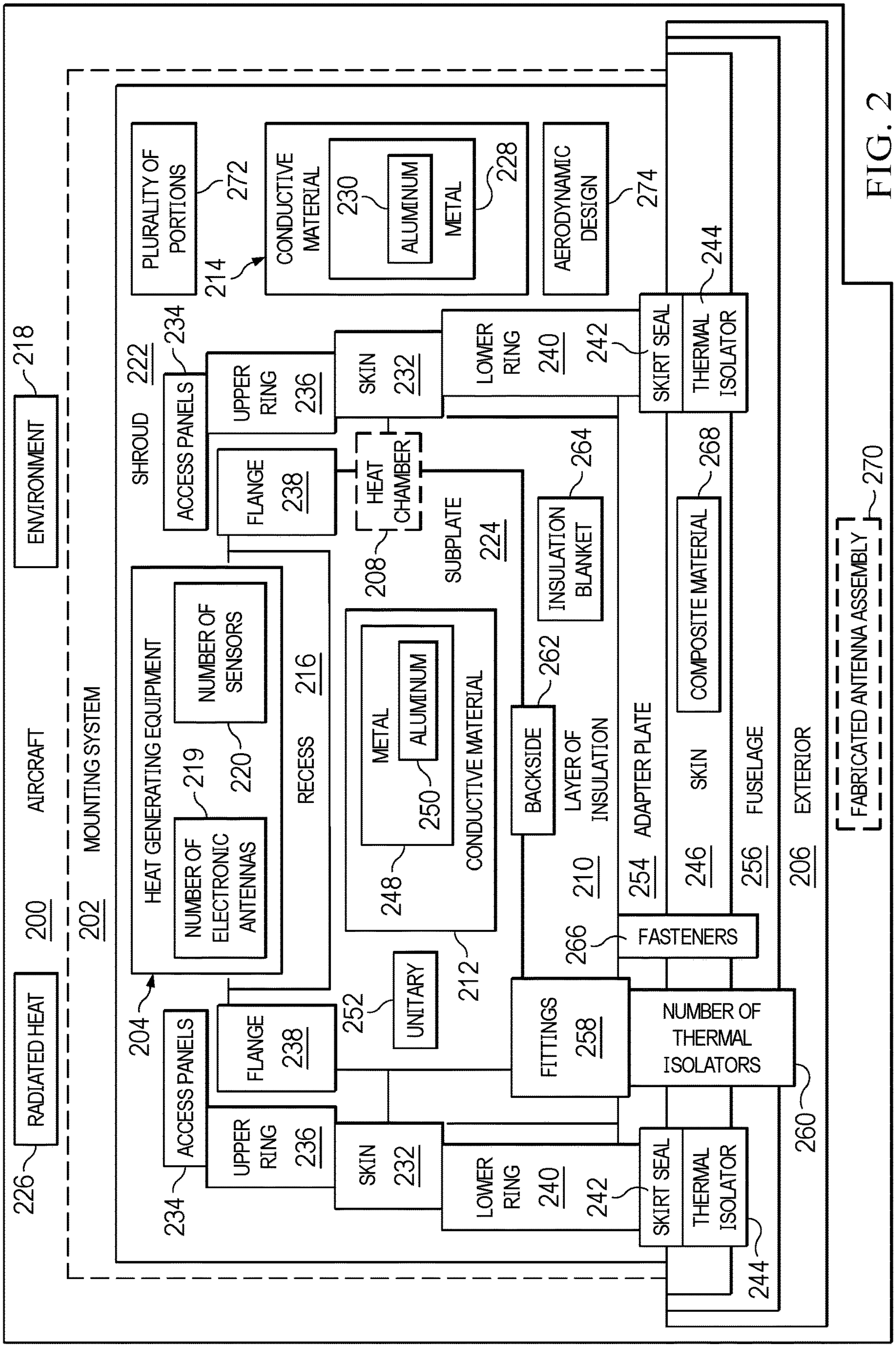
FIG. 2 is an illustration of a block diagram of an aircraft with a mounting system in accordance with an illustrative embodiment.

Turning now to FIG. 2, an illustration of a block diagram of an aircraft with a mounting system is depicted in accordance with an illustrative embodiment. Aircraft 100 can be a physical implementation of aircraft 200 of FIG. 2.

Mounting system 202 is configured to attach heat generating equipment 204 to exterior 206 of aircraft 200. Mounting system 202 comprises heat chamber 208, heat generating equipment 204, and layer of insulation 210. Heat chamber 208 is formed by a number of conductive materials, conductive material 212 and conductive material 214. Heat chamber 208 has recess 216 open to environment 218 outside aircraft 200. Heat generating equipment 204 is secured within recess 216. Layer of insulation 210 is between heat chamber 208 and aircraft 200. Layer of insulation 210 is positioned on an opposite side of heat chamber 208 than an opening of recess 216.

Layer of insulation 210 is present to reduce transmission of heat from heat generating equipment 204 to skin 246 of fuselage 256. In some illustrative examples, skin 246 is formed of composite material 268. It is desirable to reduce heat transferred to composite material 268 during operation of aircraft 200 and heat generating equipment 204.

Skin 246 of aircraft 200 has an upper temperature threshold. Depending upon the environmental temperature, environmental conditions, paint and other surface treatments on skin 246, and operational conditions for heat generating equipment 204, it can be possible to reach undesirably high temperatures, and possibly the upper temperature threshold. Mounting system 202 reduces the heat transferred to skin 246 of aircraft 200 from heat generating equipment 204. Mounting system 202 stops skin 246 from reaching the upper temperature limit due to the heat generating equipment 204.

Layer of insulation 210 is provided to shield adapter plate 254 and the underlying aircraft structures, such as skin 246 of fuselage 256, from heat generated by heat generating equipment 204 held by mounting system 202. Layer of insulation 210 can take any desirable form. In some illustrative examples, layer of insulation 210 takes the form of insulation blanket 264. In some illustrative examples, insulation blanket 264 is the same as material used in hot propulsion insulating locations. In some illustrative examples, layer of insulation 210 has a service temperature of 450 degrees Fahrenheit.

Heat generating equipment 204 takes any desirable form of heat generating equipment that is desirably secured to exterior 206 of aircraft 200. In some illustrative examples, heat generating equipment 204 comprises number of electronic antennas 219. In some illustrative examples, heat generating equipment 204 comprises number of sensors 220.

In some illustrative examples, heat chamber 208 is formed by two or more components joined together. In some illustrative examples, heat chamber 208 is formed by shroud 222 and subplate 224. Shroud 222 is configured to cover layer of insulation 210. Shroud 222 is the portion of mounting system 202 exposed to environment 218 outside of aircraft 200. Shroud 222 can also be referred to as a shell or a cover. Shroud 222 is configured to provide aerodynamic design 274.

Shroud 222 is formed of conductive material 214. By being formed of conductive material 214, shroud 222 provides lightning strike protection. By being formed of conductive material 214, shroud 222 provides a path for radiated heat 226 to exit mounting system 202. In some illustrative examples, shroud 222 is referred to as a "radiator." Radiated heat 226 is heat generated by heat generating equipment 204 and substantially isolated in heat chamber 208 by layer of insulation 210.

In some illustrative examples, conductive material 214 comprises metal 228. In some illustrative examples, metal 228 is aluminum 230. Conductive material 214 is selected taking into account at least one of weight, machinability, wearability, conductivity, and other material properties.

Shroud 222 has any desirable design configured to cover portions of mounting system 202 while leaving heat generating equipment 204 exposed to environment 218. In some illustrative examples, shroud 222 comprises a plurality of portions secured together. In some illustrative examples, shroud 222 comprises skin 232 and access panels 234. Skin 232 and access panels 234 are connected in any desirable fashion.

In some illustrative examples, skin 232 and access panels 234 are connected by upper ring 236. In some illustrative examples, upper ring 236 connects skin 232 to subplate 224. In some illustrative examples, upper ring 236 is directly connected to flange 238 of subplate 224 and skin 232. In some illustrative examples, upper ring 236 can be referred to as an upper bracket or a connecting bracket. Flange 238 of subplate 224 is secured to shroud 222.

As depicted, shroud 222 further comprises lower ring 240. In some illustrative examples, skin 232 is connected to adapter plate 254 by lower ring 240. In some illustrative examples, lower ring 240 can be referred to as a lower bracket or a connecting bracket.

As depicted, mounting system 202 further comprises skirt seal 242 connected to lower ring 240 of shroud 222. Skirt seal 242 seals mounting system 202 against liquid.

In some illustrative examples, a number of thermal isolators, thermal isolator 244, is positioned between shroud 222 and skin 246 of aircraft 200. As depicted, mounting system further comprises thermal isolator 244 positioned between lower ring 240 and skin 246 of the aircraft. Thermal isolator 244 is provided to prevent conduction of heat from shroud 222 to skin 246 of aircraft 200.

Subplate 224 is configured to support heat generating equipment 204 and forms a bottom portion of heat chamber 208. Subplate 224 is formed of conductive material 212. Subplate 224 conducts heat from heat generating equipment 204 into shroud 222 for dissipation of heat to environment 218 as radiated heat 226.

In some illustrative examples, conductive material 212 comprises metal 248. In some illustrative examples, metal 248 is aluminum 250. In some illustrative examples, subplate 224 is a unitary 252 structure. In some illustrative examples, subplate 224 is a unitary 252 metal 248 structure.

In some illustrative examples, subplate 224 comprises recess 216 and flange 238 surrounding recess 216. Recess 216 can hold any desirable type or design of heat generating equipment. Recess 216 can hold a variety of different designs of electronic antennas. In some illustrative examples, recess 216 holds number of sensors 220. As recess 216 is designed to hold any desired heat generating equipment 204, subplate 224 may be referred to as a universal component.

Subplate 224 is secured to adapter plate 254. Adapter plate 254 is configured to connect components to skin 246 of aircraft 200. Adapter plate 254 is configured to mount directly to fuselage 256 of aircraft 200. Adapter plate 254 is connected to fuselage 256 by fasteners 266. Fasteners 266 take the form of any desirable type of fasteners. In some illustrative examples, adapter plate 254 is a common component to several different designs of aircraft. In some illustrative examples, adapter plate 254 has a design common to mounting different types of components other than mounting system 202.

In some illustrative examples, aircraft 200 is already in operation and adapter plate 254 is an existing structure of aircraft 200. In some of these illustrative examples, adapter plate 254 was already present on aircraft 200 and the remaining components of mounting system 202 are retrofit onto adapter plate 254. As a result of being used for multiple functions, the possibility of retrofit, and use across multiple aircraft designs, adapter plate 254 may be referred to as a universal adapter.

Fittings 258 connect subplate 224 to adapter plate 254. Fittings 258 pierce layer of insulation 210. In some illustrative examples, number of thermal isolators 260 are positioned between subplate 224 and adapter plate 254. In some illustrative examples, number of thermal isolators 260 are associated with fittings 258 to reduce conduction of heat from subplate 224 to adapter plate 254.

A number of thermal isolators, thermal isolator 244, is positioned between heat chamber 208 and aircraft 200. Thermal isolator 244 reduces or prevents transfer of heat from heat chamber 208 to aircraft 200.

In some illustrative examples, mounting system 202 for attaching heat generating equipment 204 to exterior 206 of aircraft 200 comprises subplate 224, heat generating equipment 204, and layer of insulation 210. Subplate 224 has recess 216 surrounded by flange 238. Subplate 224 is formed of conductive material 212. Heat generating equipment 204 is positioned within recess 216. Layer of insulation 210 is secured to backside 262 of the subplate. In some illustrative examples, heat generating equipment 204 comprises number of electronic antennas 219.

In some illustrative examples, shroud 222 comprises a plurality of portions secured together. Shroud 222 is formed of conductive material 214 and is configured to provide an aerodynamic design.

In some illustrative examples, plurality of portions 272 of shroud 222 comprises skin 232 and access panels 234. Skin 246 is secured to adapter plate 254 configured to connect components to skin 246 of aircraft 200. Access panels 234 are designed to accommodate cross-sectional shapes of heat generating equipment 204.

The illustration of aircraft 200 in FIG. 2 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although not depicted, thermal isolation is provided between heat chamber 208 and adapter plate 254. For example, insulating portions are positioned between shroud 222 and adapter plate 254. Although the number of thermal isolators positioned between shroud 222 and skin 246 of aircraft 200 is depicted as thermal isolator 244, the number of thermal isolators can include more than one thermal isolator.

Figure 3:
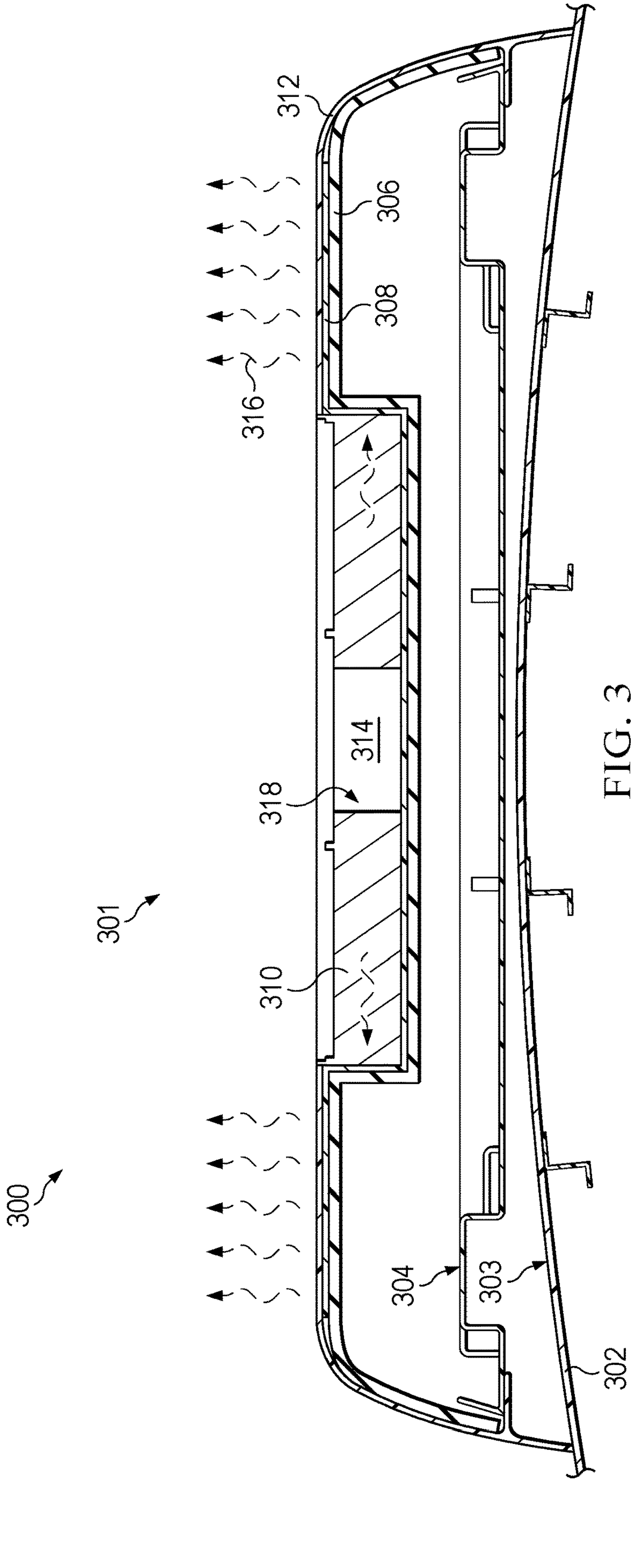
FIG. 3 is an illustration of a cross-sectional view of a mounting system for attaching heat generating equipment in accordance with an illustrative embodiment.

Turning now to FIG. 3, an illustration of a cross-sectional view of a mounting system for attaching heat generating equipment is depicted in accordance with an illustrative embodiment. View 300 of mounting system 301 is a cross-sectional view with mounting system 301 mounted to skin 302 of aircraft 303.

Mounting system 301 is a physical implementation of mounting system 202 of FIG. 2. In view 300, adapter plate 304 is connected to aircraft 303. Layer of insulation 306 is positioned between subplate 308 and adapter plate 304. Layer of insulation 306 reduces or prevents conduction of heat from heat generating equipment 310 to adapter plate 304 and skin 302 of aircraft 303.

Shroud 312 is connected to adapter plate 304 and subplate 308. Shroud 312 provides an outer shell for mounting system 301. Shroud 312 provides lightning protection, heat dissipation, and aerodynamic properties.

Subplate 308 and shroud 312 form heat chamber 314. Heat chamber 314 has heat from heat generating equipment 310. Heat chamber 314 is thermally isolated from adapter plate 304 and skin 302 of aircraft 303 by layer of insulation 306. In some illustrative examples, additional thermal isolators are positioned at connecting points of shroud 312 to adapter plate 304. In some illustrative examples, additional thermal isolators are positioned at connecting points of subplate 308 to adapter plate 304.

Heat exits heat chamber 314 as radiated heat 316. Radiated heat 316 exits recess 318 in subplate 308. Radiated heat 316 also radiates from the conductive material of shroud 312.

Figure 4:
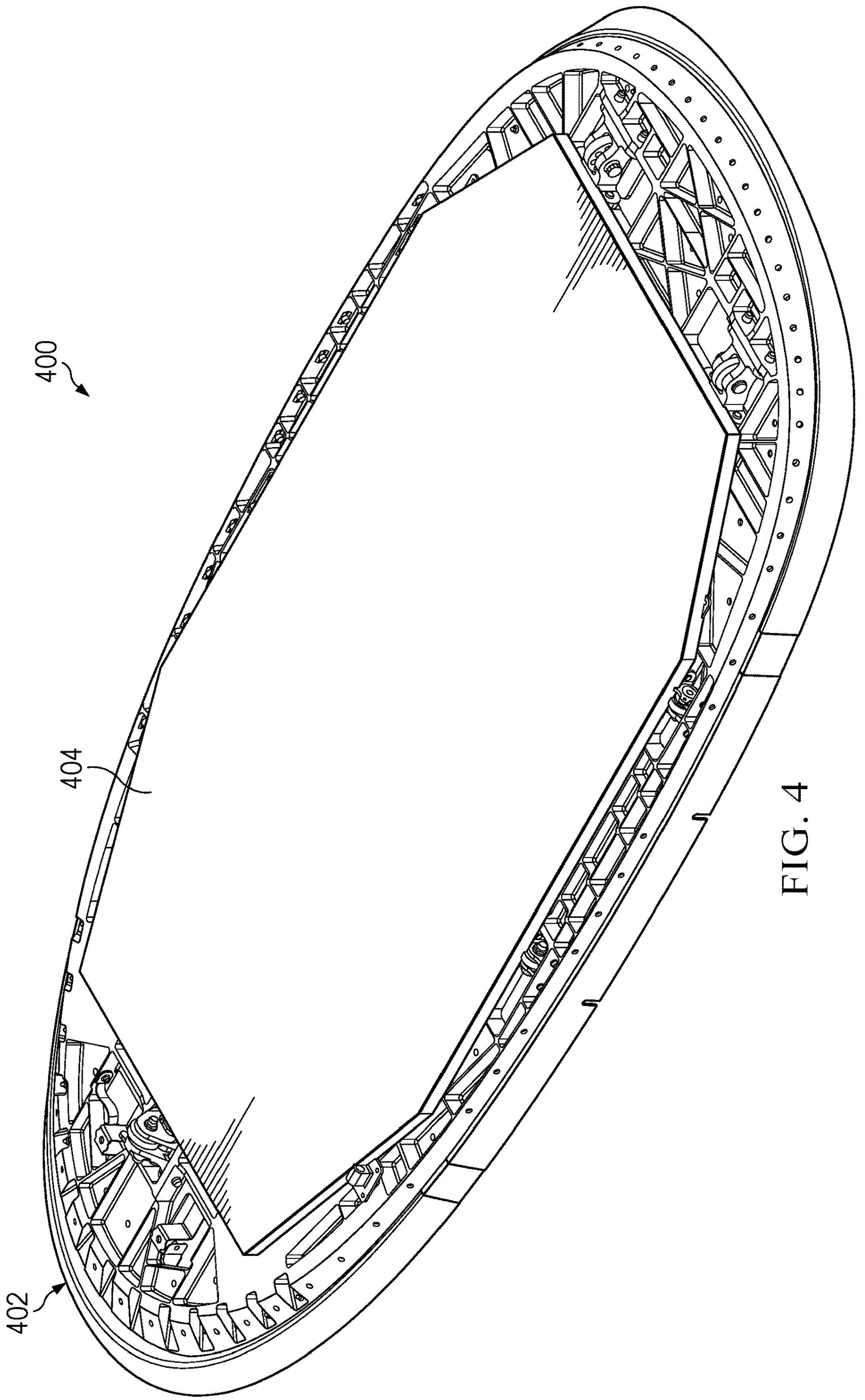
FIG. 4 is an illustration of an isometric view of portions of a mounting system for attaching heat generating equipment in accordance with an illustrative embodiment.

Turning now to FIG. 4, an illustration of an isometric view of portions of a mounting system for attaching heat generating equipment is depicted in accordance with an illustrative embodiment. Mounting system 400 comprises adapter plate 402 and layer of insulation 404. Adapter plate 402 is a physical implementation of adapter plate 254 of FIG. 2. Layer of insulation 404 is a physical implementation of layer of insulation 210 of FIG. 2.

Adapter plate 402 is configured to mount directly to a fuselage of an aircraft. Adapter plate 402 can already be present on an aircraft if other components of mounting system 400 are a retrofit. In some illustrative examples, adapter plate 402 has a design common to multiple designs of aircraft. As a result of being used for multiple functions, the possibility of retrofit, and use across multiple aircraft designs, adapter plate 402 may be referred to as a universal adapter.

Layer of insulation 404 is provided to shield adapter plate 402 and the underlying aircraft structures from heat generated by heat generating equipment held by mounting system 400. In some illustrative examples, layer of insulation 404 takes the form of an insulation blanket. Although layer of insulation 404 is shown as applied to adapter plate 402 as a first step, in other illustrative examples, layer of insulation 404 can be connected first to an additional component, such as subplate 224 of FIG. 2. In some illustrative examples, layer of insulation 404 is part of fabricated antenna assembly 270 of FIG. 2 which is connected to adapter plate 402 as one section.

Figure 5:
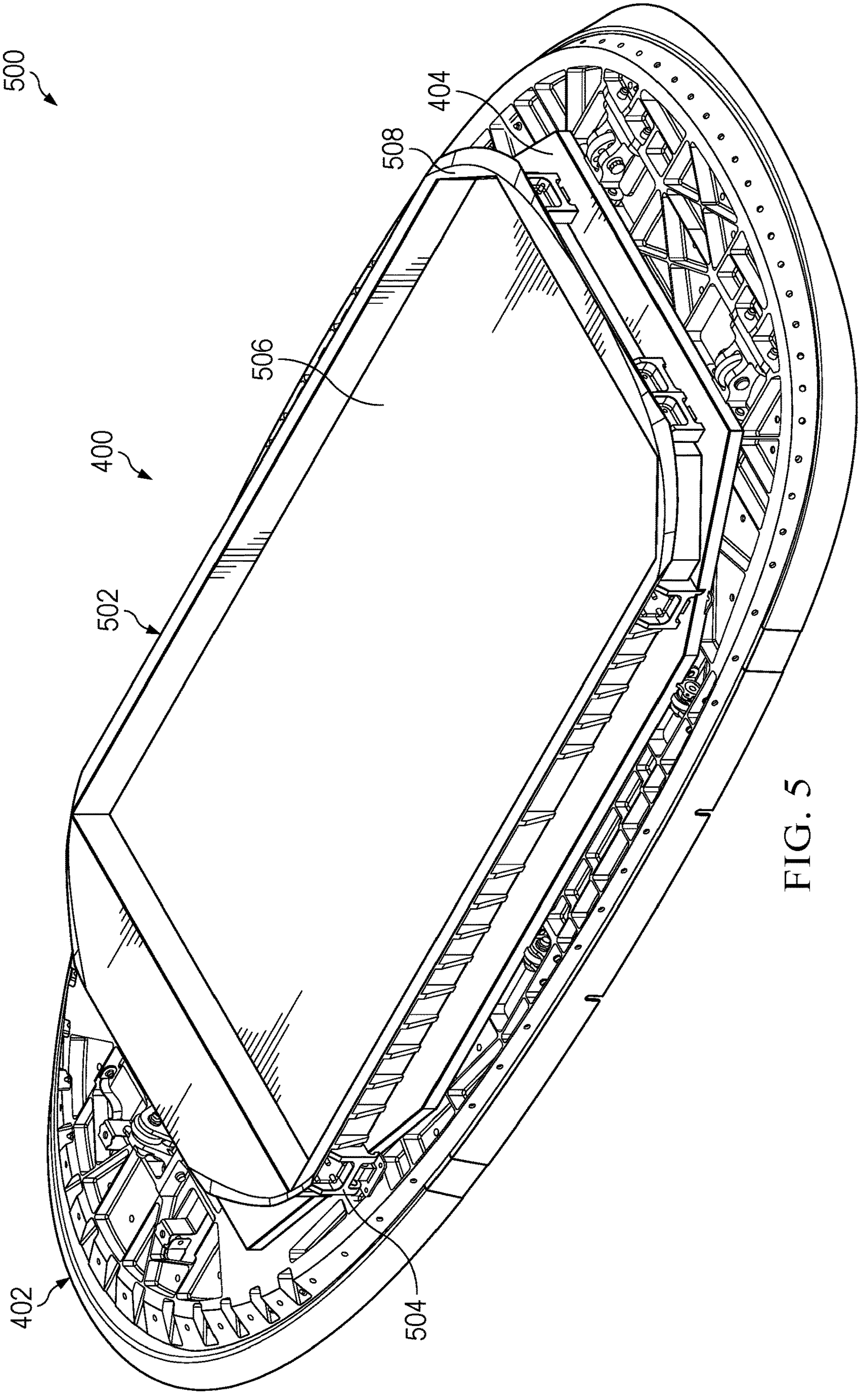
FIG. 5 is an illustration of an isometric view of portions of a mounting system for attaching heat generating equipment in accordance with an illustrative embodiment.

Turning now to FIG. 5, an illustration of an isometric view of portions of a mounting system for attaching heat generating equipment is depicted in accordance with an illustrative embodiment. In view 500 of mounting system 400, subplate 502 is also depicted. Subplate 502 is connected to adapter plate 402 by fittings 504. Fittings 504 extend through layer of insulation 404. Sealant (not depicted) will be applied to seal layer of insulation 404 at locations where fittings 504 extend through layer of insulation 404. The sealant discourages entry of liquids into layer of insulation 404. In some illustrative examples, the sealant is also insulative such that heat does not extend through layer of insulation 404 at locations of fittings 504.

Subplate 502 is configured to support heat generating equipment such as sensors or antennas. Subplate 502 comprises recess 506. When assembled, the heat generating equipment is positioned within recess 506. Flange 508 extends around recess 506. Flange 508 is configured for securing subplate 502 to a shroud, such as shroud portion 702 depicted in FIG. 7.

As depicted, subplate 502 is a unitary structure. Subplate 502 is formed of a single piece of conductive material. Subplate 502 is configured to form a portion of a heating chamber of mounting system 400.

Subplate 502 is configured to support any desired type of heat generating equipment. Subplate 502 can be described as a universal component.

Figure 6:
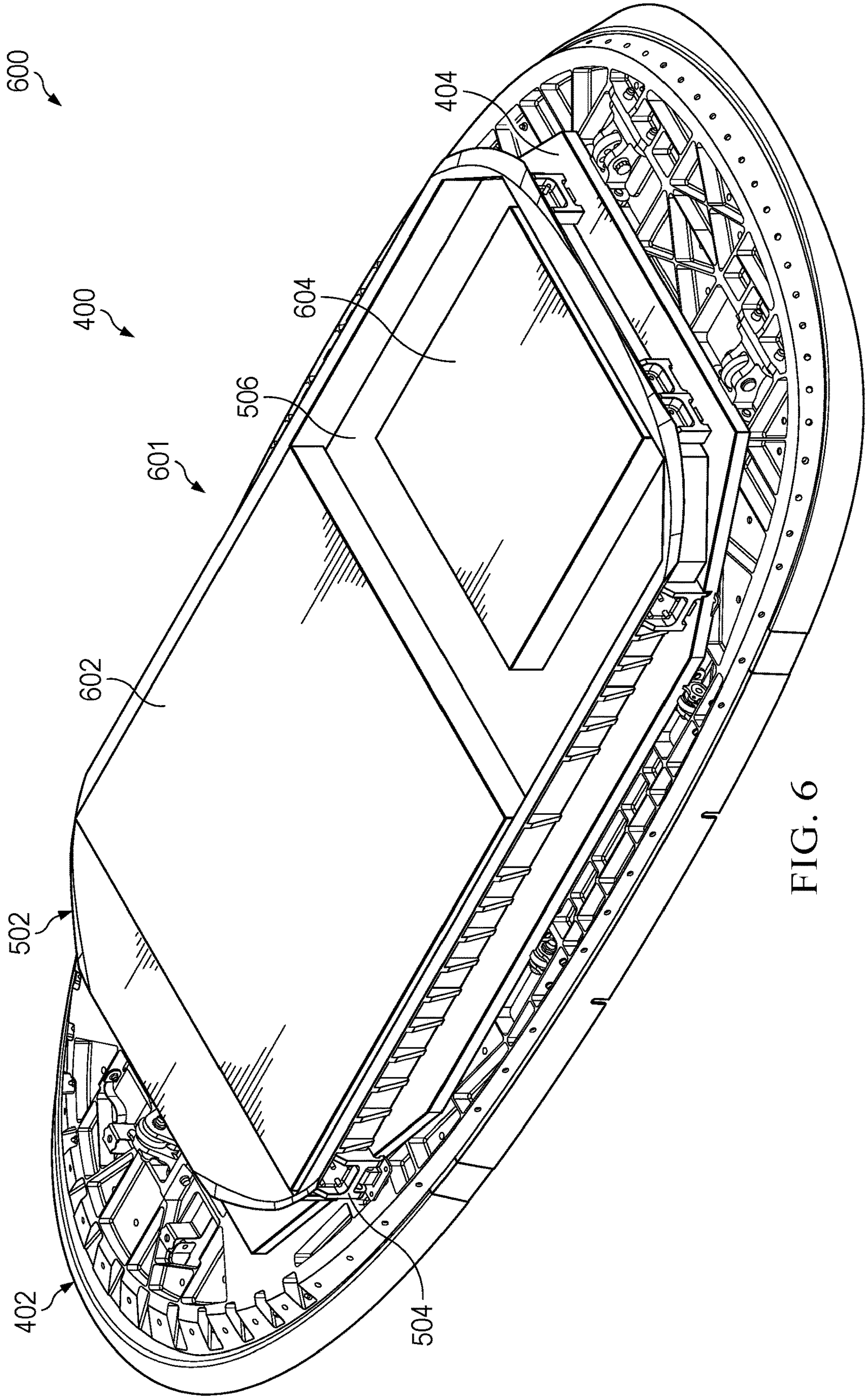
FIG. 6 is an illustration of an isometric view of portions of a mounting system for attaching heat generating equipment in accordance with an illustrative embodiment.

Turning now to FIG. 6, an illustration of an isometric view of portions of a mounting system for attaching heat generating equipment is depicted in accordance with an illustrative embodiment. View 600 is a view of mounting system 400 with heat generating equipment 601 within recess 506 of subplate 502. In this illustrative example, heat generating equipment 601 comprises electronic antenna 602 and electronic antenna 604. In view 600, electronic antenna 602 and electronic antenna 604 are positioned within recess 506 of subplate 502.

In some illustrative examples, layer of insulation 404, subplate 502, and heat generating equipment 601 are assembled into a prefabricated antenna assembly prior to connecting subplate 502 to adapter plate 402. By securing heat generating equipment 601 in subplate 502 prior to securing subplate 502 to adapter plate 402, assembly time on the final assembly line can be reduced. Connecting heat generating equipment 601 offline can reduce manufacturing time.

Figure 7:
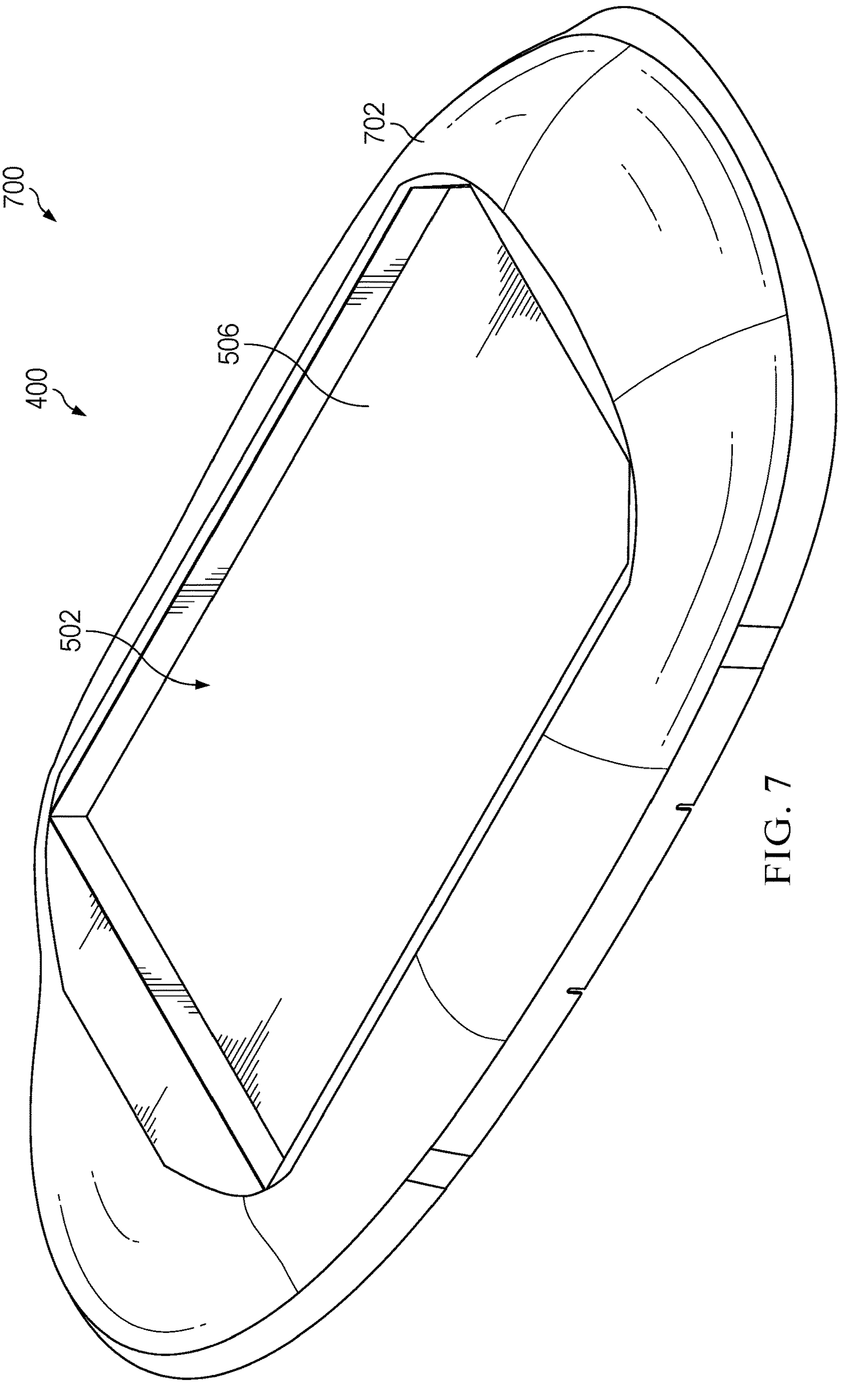
FIG. 7 is an illustration of an isometric view of portions of a mounting system for attaching heat generating equipment in accordance with an illustrative embodiment.

Turning now to FIG. 7, an illustration of an isometric view of portions of a mounting system for attaching heat generating equipment is depicted in accordance with an illustrative embodiment. In view 700 of mounting system 400, shroud portion 702 has been connected to subplate 502 and adapter plate 402 of FIG. 4. Although shroud portion 702 appears to be one component, shroud portion 702 can be formed of multiple components connected together. In some illustrative examples, shroud portion 702 comprises a skin.

Figure 8:
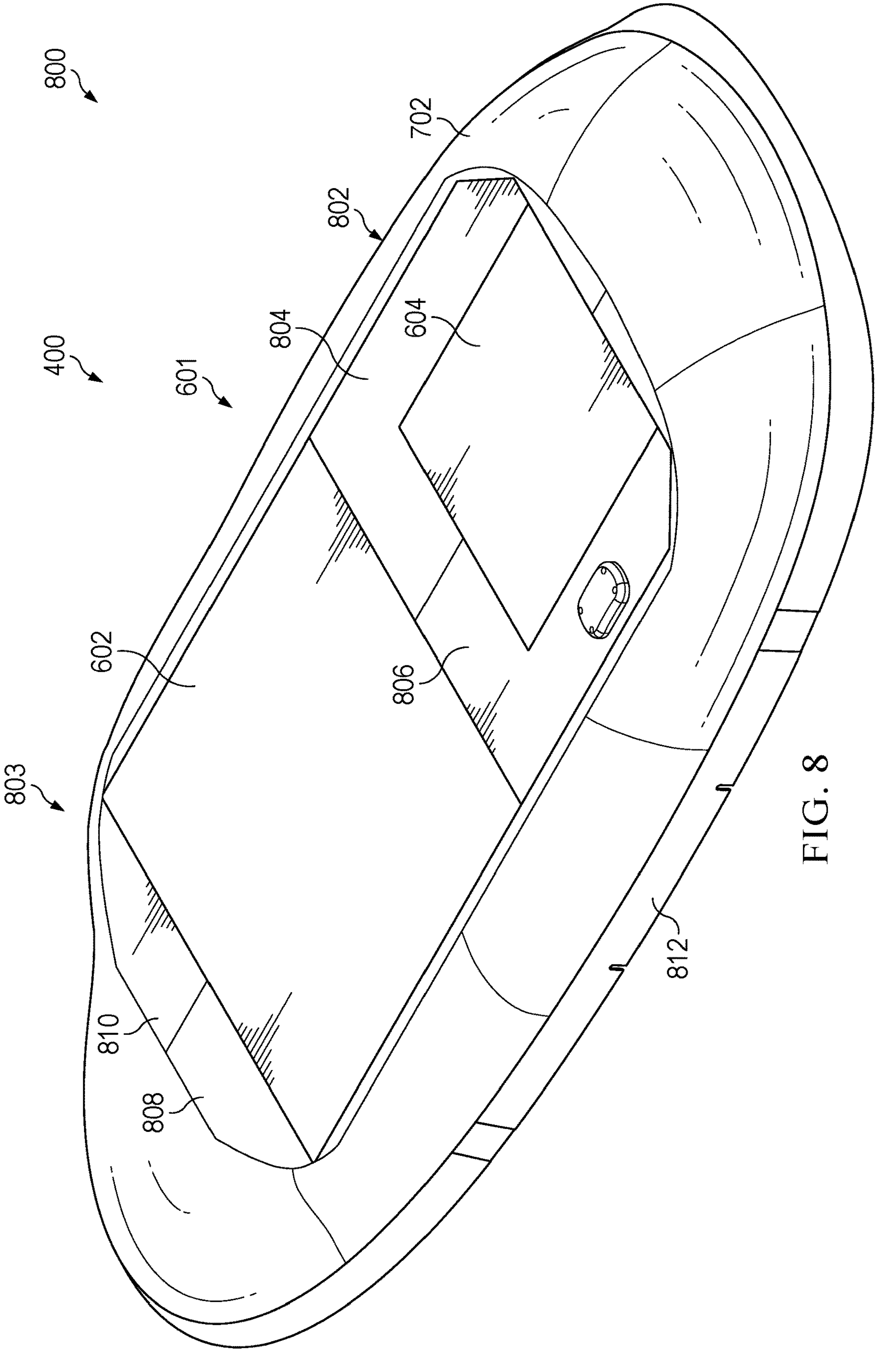
FIG. 8 is an illustration of an isometric view of portions of a mounting system for attaching heat generating equipment in accordance with an illustrative embodiment.

Turning now to FIG. 8, an illustration of an isometric view of portions of a mounting system for attaching heat generating equipment is depicted in accordance with an illustrative embodiment. View 800 of mounting system 400 is a fully assembled system.

In view 800, shroud 802 comprises shroud portion 702 and access panels 803. Access panels 803 are configured based on the design and location of heat generating equipment 601. By having access panels 803, shroud portion 702 can be used for any type or design of heat generating equipment that can be present in recess 506 of subplate 502. Access panels 803 include access panel 804, access panel 806, access panel 808, and access panel 810. Each of shroud portion 702 and access panels 803 is connected to subplate 502.

Skirt seal 812 is connected to shroud portion 702. Skirt seal 812 is configured to seal to a fuselage of an aircraft to reduce fluid intrusion into mounting system 400.

Figure 9:
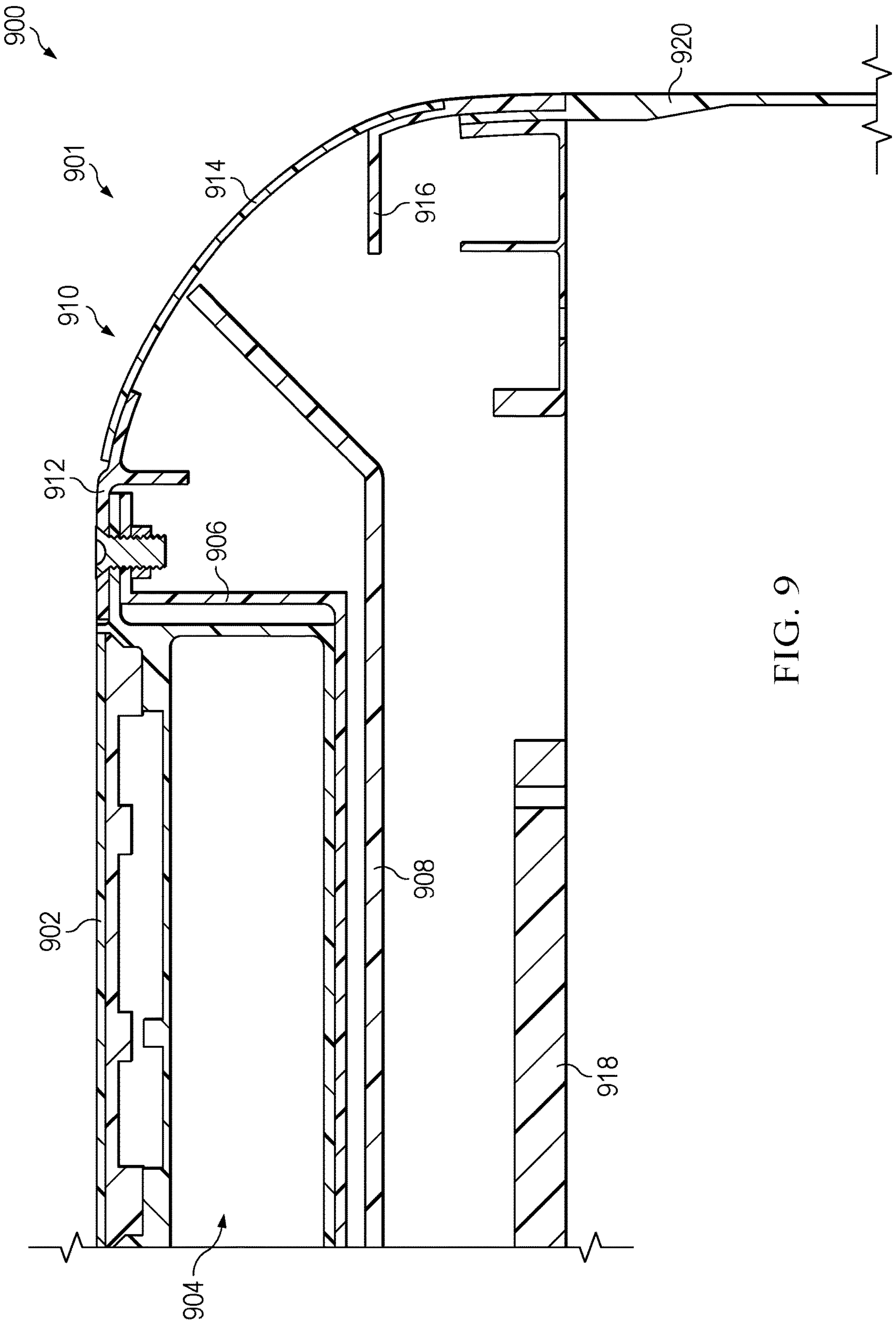
FIG. 9 is an illustration of a cross-sectional view of portions of a mounting system for attaching heat generating equipment in accordance with an illustrative embodiment.

Turning now to FIG. 9, an illustration of a cross-sectional view of portions of a mounting system for attaching heat generating equipment is depicted in accordance with an illustrative embodiment. View 900 is a cross-sectional view of mounting system 901. Mounting system 901 is a physical implementation of mounting system 202 of FIG. 2. Mounting system 901 can be the same as mounting system 301 of FIG. 3. Mounting system 901 can be the same as mounting system 400 of FIGS. 4-8.

In view 900 of mounting system 901, heat generating equipment 904 takes the form of number of electronic antennas 902. Number of electronic antennas 902 is positioned in subplate 906. Number of electronic antennas 902 is exposed to the environment outside of mounting system 901.

Subplate 906 is connected to shroud 910. Shroud 910 comprises upper ring 912, skin 914, and lower ring 916. Shroud 910 is connected to adapter plate 918.

Although not depicted in view 900, subplate 906 is connected to adapter plate 918 in discrete locations. Although not depicted in view 900, adapter plate 918 is mounted to a fuselage of an aircraft.

Shroud 910, subplate 906, and layer of insulation 908 form a heat chamber. Layer of insulation 908 reduces the heat traveling from heat chamber to aircraft structures beneath layer of insulation 908. Layer of insulation 908 reduces the heat transferred from heat generating equipment 904 to adapter plate 918 and the aircraft skin (not depicted) beneath adapter plate 918. Additionally, a distance between subplate 906 and adapter plate 918 reduces the heat reaching adapter plate 918. The distance between subplate 906 and adapter plate 918 provides passive control of the heat experienced by adapter plate 918. Skirt seal and thermal isolator 920 reduces heat transferred from shroud 910 to the fuselage.

Heat generated by heat generating equipment 904 is radiated to the environment outside of mounting system 901. Heat generating equipment 904 directly radiates heat to the environment. Additionally, heat radiates out from shroud 910.

Figure 10:
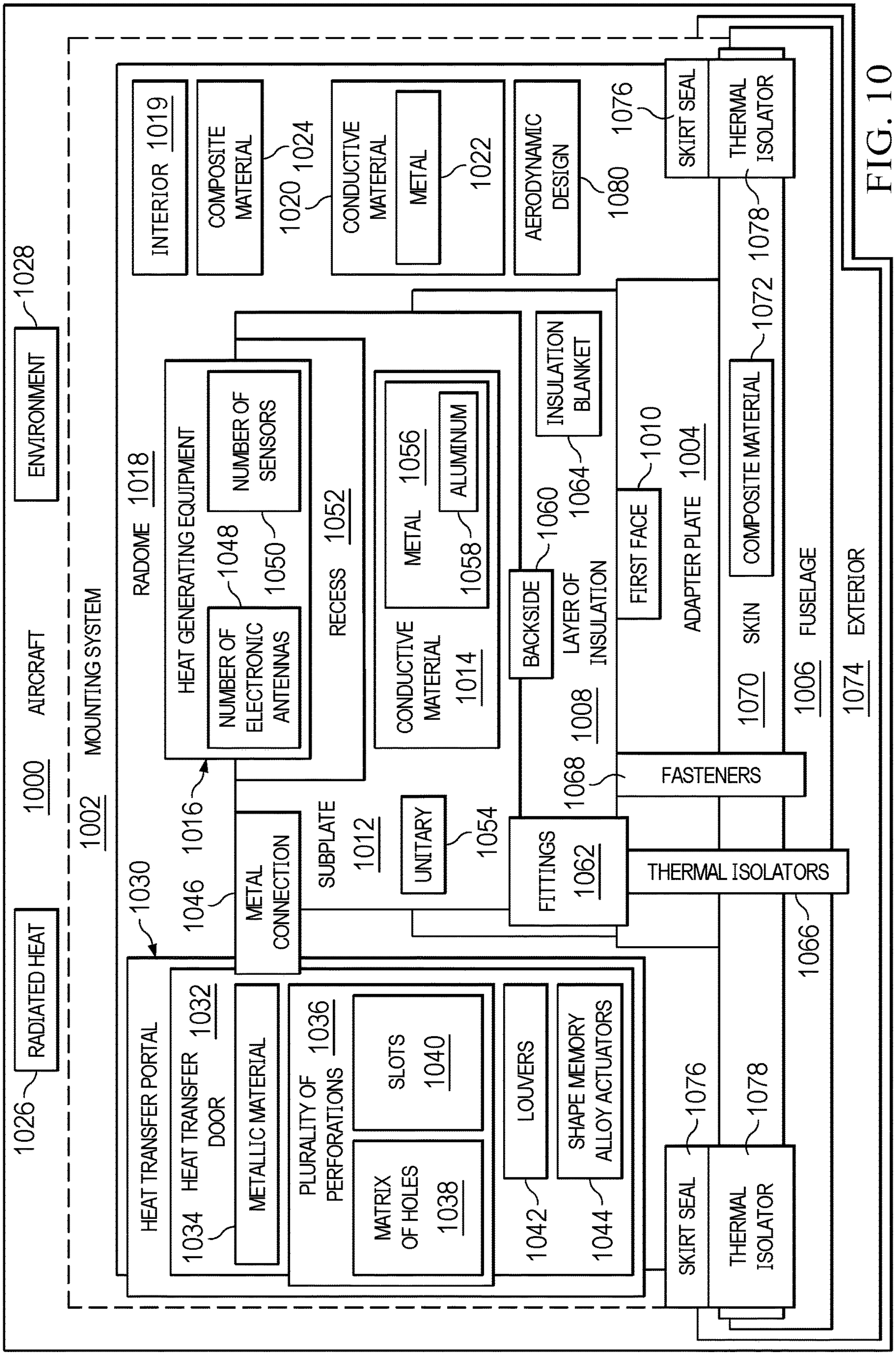
FIG. 10 is an illustration of a block diagram of an aircraft with a mounting system in accordance with an illustrative embodiment.

Turning now to FIG. 10, an illustration of a block diagram of an aircraft with a mounting system is depicted in accordance with an illustrative embodiment. Aircraft 100 can be a physical implementation of aircraft 1000 of FIG. 10.

Mounting system 1002 is configured to attach heat generating equipment 1016 to exterior 1074 of aircraft 1000. Mounting system 1002 comprises adapter plate 1004, layer of insulation 1008, subplate 1012, heat generating equipment 1016, and radome 1018. Adapter plate 1004 is connected to fuselage 1006 of aircraft 1000. Layer of insulation 1008 substantially covers first face 1010 of adapter plate 1004. Subplate 1012 is formed of conductive material 1014 and is connected to adapter plate 1004 such that layer of insulation 1008 is positioned between subplate 1012 and adapter plate 1004. In some illustrative examples, layer of insulation 1008 is in contact with backside 1060 of subplate 1012. Heat generating equipment 1016 is secured within subplate 1012. Radome 1018 is connected to adapter plate 1004 and positioned to cover heat generating equipment 1016 and subplate 1012.

Layer of insulation 1008 is present to reduce transmission of heat from heat generating equipment 1016 to skin 1070 of fuselage 1006. In some illustrative examples, skin 1070 is formed of composite material 1072. It is desirable to reduce heat transferred to composite material 1072 during operation of aircraft 1000 and heat generating equipment 1016.

Skin 1070 of aircraft 1000 has an upper temperature threshold. Depending upon the environmental temperature, environmental conditions, paint and other surface treatments on skin 1070, and operational conditions for heat generating equipment 1016, it can be possible to reach undesirably high temperatures, and possibly the upper temperature threshold. Mounting system 1002 reduces the heat transferred to skin 1070 of aircraft 1000 from heat generating equipment 1016. Mounting system 1002 stops skin 1070 from reaching the upper temperature limit due to the heat generating equipment 1016.

Layer of insulation 1008 is provided to shield adapter plate 1004 and the underlying aircraft structures, such as skin 1070 of fuselage 1006, from heat generated by heat generating equipment 1016 held by mounting system 1002. Layer of insulation 1008 can take any desirable form. In some illustrative examples, layer of insulation 1008 takes the form of insulation blanket 1064. In some illustrative examples, insulation blanket 1064 is the same as material used in hot propulsion insulating locations. In some illustrative examples, layer of insulation 1008 has a service temperature of 450 degrees Fahrenheit.

Radome 1018 is connected to adapter plate 1004 such that heat generating equipment 1016 is positioned within interior 1019 of radome 1018. Radome 1018 is connected to adapter plate 1004 with thermal isolator 1078 to reduce or prevent heat transfer from radome 1018 to adapter plate 1004, skin 1070, and fuselage 1006. Skirt seal 1076 seals radome 1018 to skin 1070 to reduce liquid entry into interior 1019 of radome 1018.

In some illustrative examples, radome 1018 is formed of conductive material 1020. Conductive material 1020 can take the form of metal 1022. When radome 1018 is formed of conductive material 1020, heat from heat generating equipment 1016 can escape radome 1018 as radiated heat 1026 into environment 1028 outside of radome 1018. In some illustrative examples, when radome 1018 is formed of conductive material 1020, radome 1018 can have a conventional design. In some illustrative examples, when radome 1018 is formed of conductive material 1020, radome 1018 does not have any additional heat dissipating design or features.

In some illustrative examples, radome 1018 is formed of composite material 1024. In some illustrative examples, heat transfer portal 1030 extends through radome 1018. Heat transfer portal 1030 is an opening within radome 1018. When present, heat transfer portal 1030 provides a pathway for heat to exit from interior 1019 of radome 1018.

In some illustrative examples, radome 1018 is an off-the-shelf part. When radome 1018 is an off-the-shelf part, heat transfer portal 1030 is cut into radome 1018. In some illustrative examples, radome 1018 is designed and manufactured for mounting system 1002. In some illustrative examples, when radome 1018 is manufactured for mounting system 1002, heat transfer portal 1030 can be formed into radome 1018 during manufacturing. For example, when radome 1018 is formed of composite material 1024, heat transfer portal 1030 can be formed during layup of composite material 1024.

Radome 1018 is configured with aerodynamic design 1080. In some illustrative examples, heat transfer portal 1030 is present in an aft section of radome 1018. Having heat transfer portal 1030 in an aft section of radome 1018 can reduce drag in aerodynamic design 1080.

In some illustrative examples, heat transfer door 1032 is present in mounting system 1002. In some illustrative examples, heat transfer door 1032 is positioned within heat transfer portal 1030. Heat transfer door 1032 is configured to transfer heat from interior 1019 of radome 1018 to environment 1028 outside of mounting system 1002.

In some illustrative examples, heat transfer door 1032 comprises metallic material 1034 with plurality of perforations 1036 in metallic material 1034. Plurality of perforations 1036 is configured to allow heat to escape interior 1019 via plurality of perforations 1036.

In some illustrative examples, perforations of plurality of perforations 1036 take the form of one of matrix of holes 1038, plurality of slots 1040, or plurality of overlapping louvers 1042.

Matrix of holes 1038 includes any desirable layout of holes. In some illustrative examples, matrix of holes 1038 can include columns and rows of holes. In some illustrative examples, matrix of holes 1038 can include staggered rows of holes. The holes of matrix of holes 1038 can have any desirable shape. In some illustrative examples, the holes of matrix of holes 1038 can be at least one of round, square, elliptical, triangular, or any other desirable shape of hole. Plurality of slots 1040 can have any desirable layout and any desirable dimensions.

In some illustrative examples, heat transfer door 1032 comprises louvers 1042. In these illustrative examples, louvers 1042 can radiate heat to environment 1028. When present, louvers 1042 increase surface area of metallic material 1034 to radiate heat to environment 1028 from heat transfer door 1032. In some illustrative examples, louvers 1042 are stationary. When louvers 1042 are stationary, the angle of louvers 1042 is fixed. In some illustrative examples, louvers 1042 are moveable. When louvers 1042 are moveable, the angle of louvers 1042 is adjustable.

In some illustrative examples, heat transfer door 1032 comprises actuators connected to louvers 1042. In some illustrative examples, heat transfer door 1032 comprises shape memory alloy actuators 1044.

In some illustrative examples, heat travels within interior 1019 of radome 1018 to exit through heat transfer door 1032. In some illustrative examples, mounting system 1002 comprises metal connection 1046 positioned between heat transfer door 1032 and subplate 1012. In some illustrative examples, metal connection 1046 is configured to conduct heat between subplate 1012 and heat transfer door 1032.

Heat generating equipment 1016 takes any desirable form of heat generating equipment that is desirably secured to exterior 1074 of aircraft 1000. In some illustrative examples, heat generating equipment 1016 comprises number of electronic antennas 1048. In some illustrative examples, heat generating equipment 1016 comprises number of sensors 1050. Heat generating equipment 1016 is positioned within recess 1052 in subplate 1012.

Subplate 1012 is connected to adapter plate 1004. In some illustrative examples, subplate 1012 is formed of conductive material 1014. In some illustrative examples, conductive material 1014 takes the form of metal 1056 such as aluminum 1058. In some illustrative examples, subplate 1012 is a unitary 1054 metal 1056 structure.

Subplate 1012 is secured to adapter plate 1004. Adapter plate 1004 is configured to connect components to skin 1070 of aircraft 1000. Adapter plate 1004 is configured to mount directly to fuselage 1006 of aircraft 1000. Adapter plate 1004 is connected to fuselage 1006 by fasteners 1068. Fasteners 1068 take the form of any desirable type of fasteners. In some illustrative examples, adapter plate 1004 is a common component to several different designs of aircraft. In some illustrative examples, adapter plate 1004 has a design common to mounting different types of components other than mounting system 1002.

Subplate 1012 is connected to adapter plate 1004 by fittings 1062 that extend through layer of insulation 1008. In some illustrative examples, thermal isolators 1066 reduce transfer of heat from subplate 1012 to adapter plate 1004 through fittings 1062.

The illustration of aircraft 1000 in FIG. 10 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although only one heat transfer door is depicted, other non-depicted examples can include more than one heat transfer door. As another example, fasteners are not depicted for radome 1018, but fasteners will connect radome 1018 to adapter plate 1004.

Figure 11:
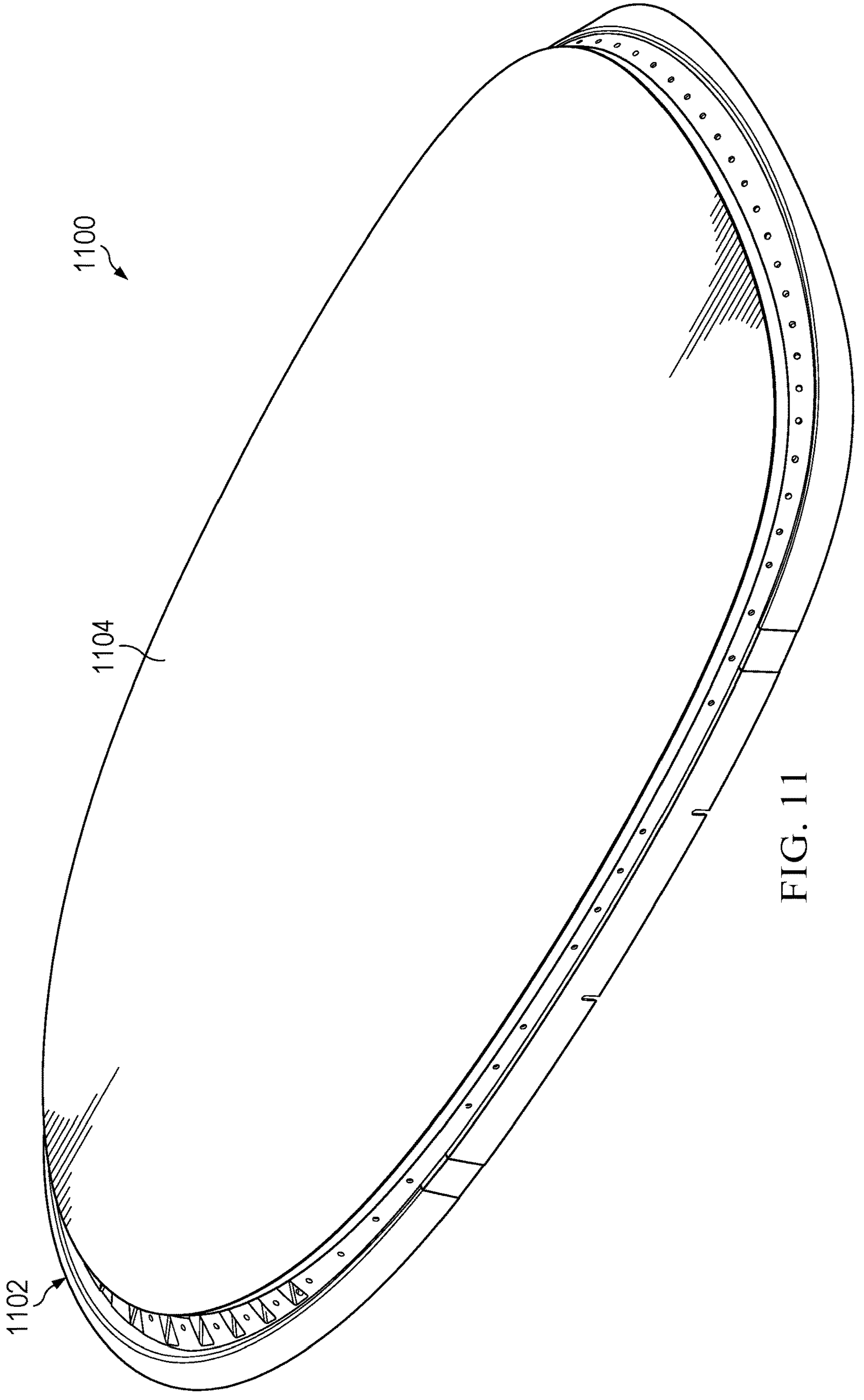
FIG. 11 is an illustration of an isometric view of portions of a mounting system for attaching heat generating equipment in accordance with an illustrative embodiment.

Turning now to FIG. 11, an illustration of an isometric view of portions of a mounting system for attaching heat generating equipment is depicted in accordance with an illustrative embodiment. Mounting system 1100 is a physical implementation of mounting system 1002 of FIG. 10. Mounting system 1100 can be used to mount heat generating equipment on aircraft 100 of FIG. 1.

Mounting system 1100 comprises adapter plate 1102 and layer of insulation 1104. Adapter plate 1102 is configured to mount components to an exterior of an aircraft, such as aircraft 1000 of FIG. 10. Adapter plate 1102 can be used to mount any desirable components to the exterior of the aircraft. Layer of insulation 1104 is positioned to cover a first face of adapter plate 1102. Layer of insulation 1104 to reduce or prevent heat from traveling to adapter plate 1102.

Figure 12:
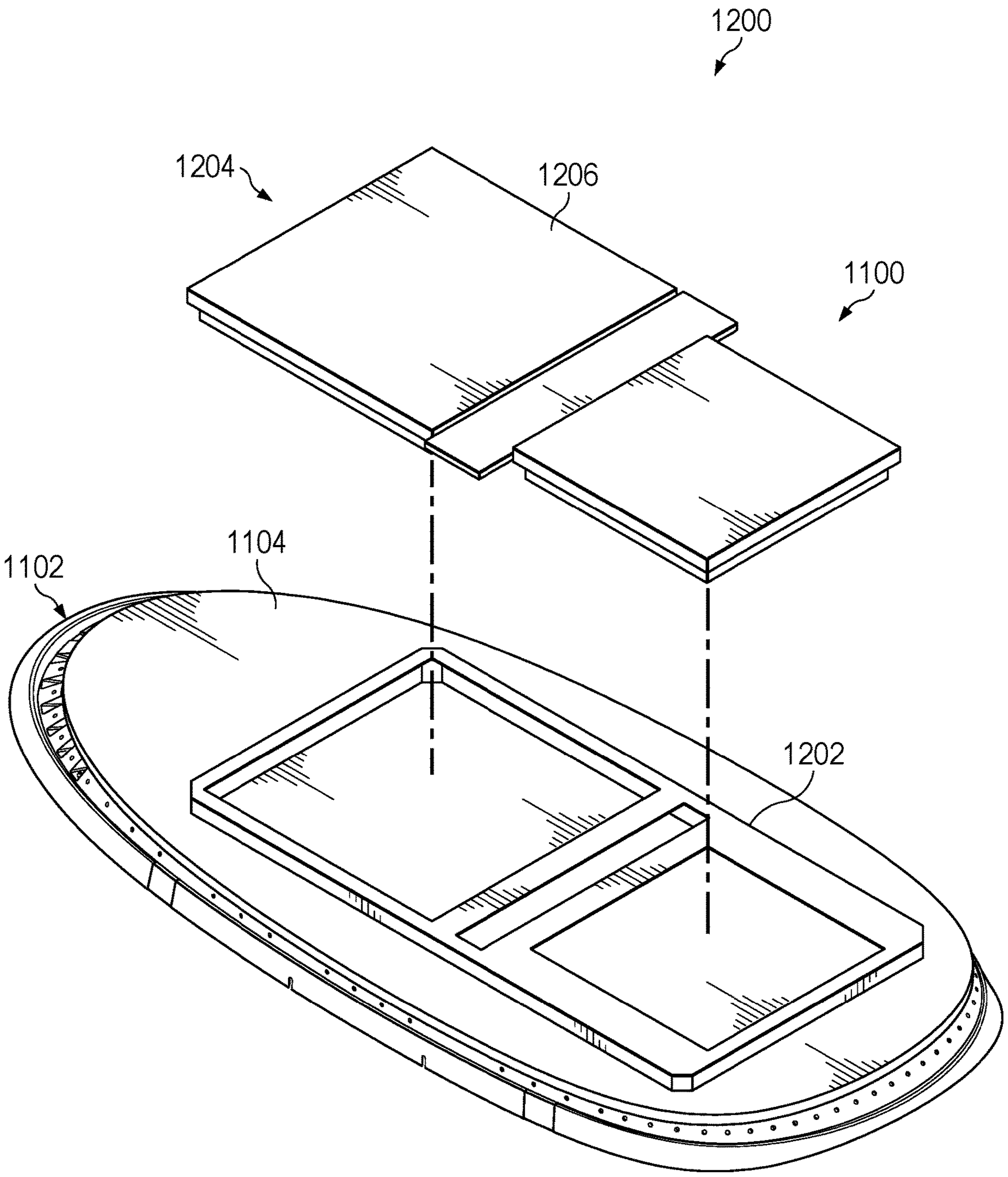
FIG. 12 is an illustration of an isometric view of portions of a mounting system for attaching heat generating equipment in accordance with an illustrative embodiment.

Turning now to FIG. 12, an illustration of an isometric view of portions of a mounting system for attaching heat generating equipment is depicted in accordance with an illustrative embodiment. In view 1200, subplate 1202 is present over layer of insulation 1104. Subplate 1202 is connected to adapter plate 1102. Layer of insulation 1104 extends between subplate 1202 and adapter plate 1102.

Heat generating equipment 1204 is shown exploded over subplate 1202. In this illustrative example, heat generating equipment 1204 takes the form of number of electronic antennas 1206. Number of electronic antennas 1206 will be connected to subplate 1202.

Figure 13:
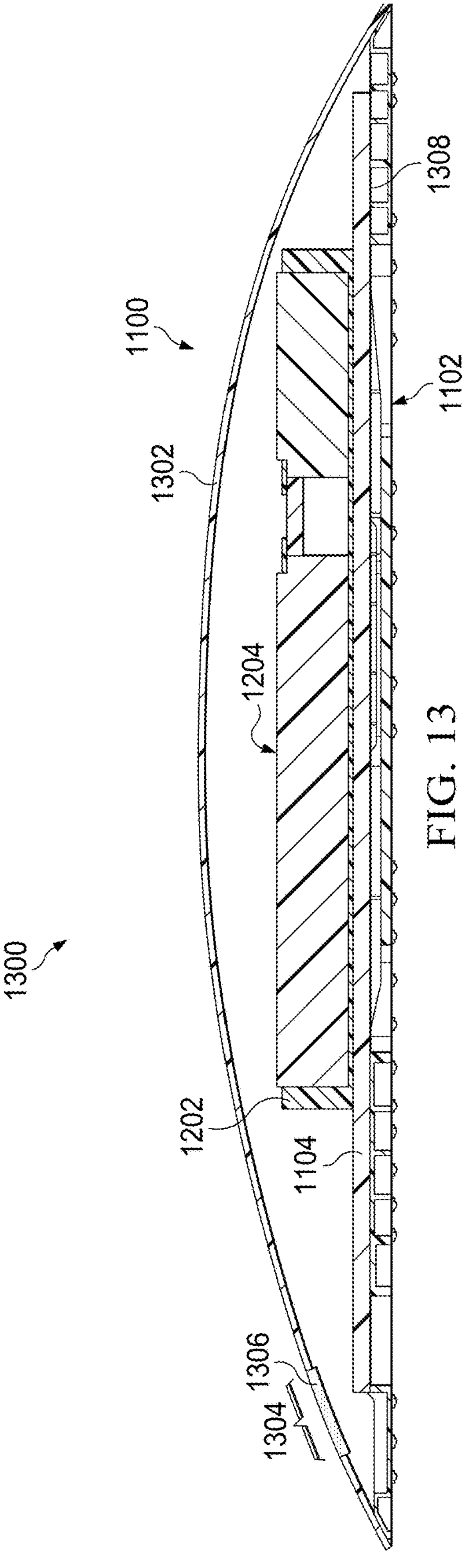
FIG. 13 is an illustration of a cross-sectional view of a mounting system for attaching heat generating equipment in accordance with an illustrative embodiment.

Turning now to FIG. 13, an illustration of a cross-sectional view of a mounting system for attaching heat generating equipment is depicted in accordance with an illustrative embodiment. In view 1300 radome 1302 has been connected to adapter plate 1102 in mounting system 1100. Radome 1302 is a physical implementation of radome 1018 of FIG. 10. Radome 1302 is connected to adapter plate 1102 and is positioned to cover heat generating equipment 1204 and subplate 1202.

Layer of insulation 1104 is positioned over first face 1308 of adapter plate 1102. Number of electronic antennas 1206 are connected in subplate 1202.

In this illustrative example, heat transfer portal 1304 is present in radome 1302. Heat transfer portal 1304 is an opening formed in radome 1302. Heat transfer portal 1304 can be formed through at least one of machining, molding, or material layup. In this illustrative example, heat transfer door 1306 is present in heat transfer portal 1304. Heat transfer door 1306 is configured to radiate heat from radome 1302. Heat transfer door 1306 is formed of a metallic material to radiate heat to an environment outside of radome 1302. Heat transfer door 1306 comprises a plurality of perforations (not depicted) to allow heat to escape from radome 1302. The plurality of perforations includes any desirable quantity, positioning, size, and shape of perforations. In other non-depicted examples, heat transfer door 1306 can comprise a plurality of louvers.

Figure 14:
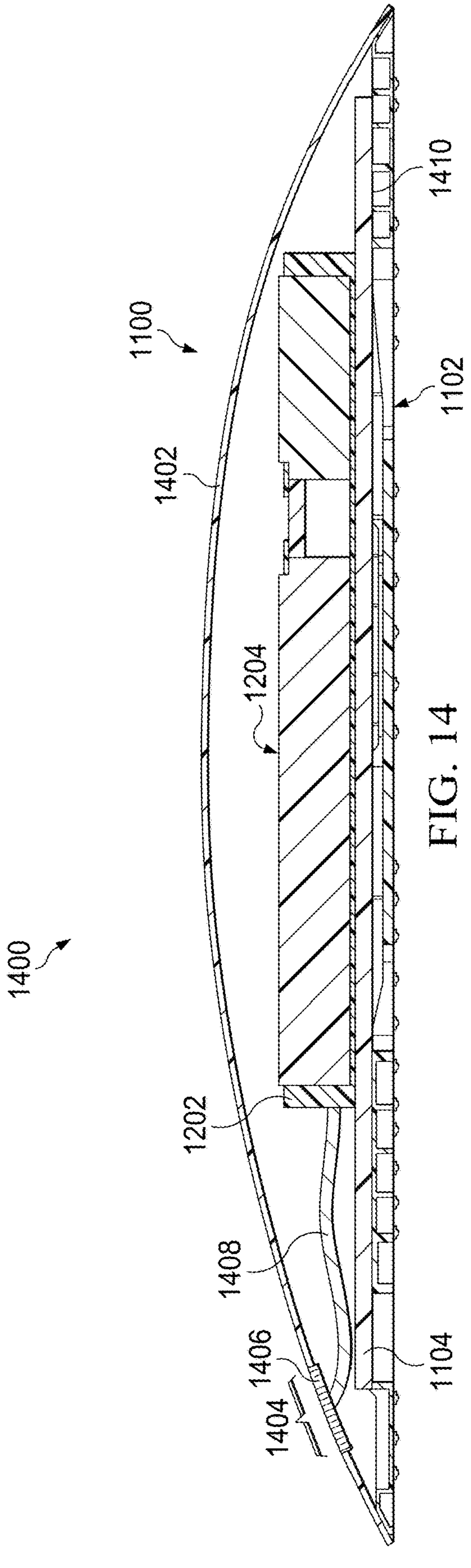
FIG. 14 is an illustration of a cross-sectional view of a mounting system for attaching heat generating equipment in accordance with an illustrative embodiment.

Turning now to FIG. 14, an illustration of a cross-sectional view of a mounting system for attaching heat generating equipment is depicted in accordance with an illustrative embodiment. In view 1400 radome 1402 has been connected to adapter plate 1102 in mounting system 1100. Radome 1402 is a physical implementation of radome 1018 of FIG. 10. Radome 1402 is connected to adapter plate 1102 and is positioned to cover heat generating equipment 1204 and subplate 1202.

Layer of insulation 1104 is positioned over first face 1410 of adapter plate 1102. Heat generating equipment 1204 is connected in subplate 1202.

In this illustrative example, heat transfer portal 1404 is present in radome 1402. Heat transfer portal 1404 is an opening formed in radome 1402. Heat transfer portal 1404 can be formed through at least one of machining, molding, or material layup. In this illustrative example, heat transfer door 1406 is present in heat transfer portal 1404. Heat transfer door 1406 is configured to radiate heat from radome 1402. Heat transfer door 1406 is formed of a metallic material to radiate heat to an environment outside of radome 1402. Heat transfer door 1406 comprises a plurality of perforations to allow heat to escape from radome 1402. The plurality of perforations includes any desirable quantity, positioning, size, and shape of perforations. In other non-depicted examples, heat transfer door 1406 can comprise a plurality of louvers.

In view 1400, metal connection 1408 is present in mounting system 1100. Metal connection 1408 is formed of any desirable metal configured to provide heat conduction. Metal connection 1408 contacts subplate 1202. Metal connection 1408 contacts heat transfer door 1406. Metal connection 1408 conducts heat from subplate 1202 to heat transfer door 1406 to remove heat from beneath radome 1402.

Figure 15:
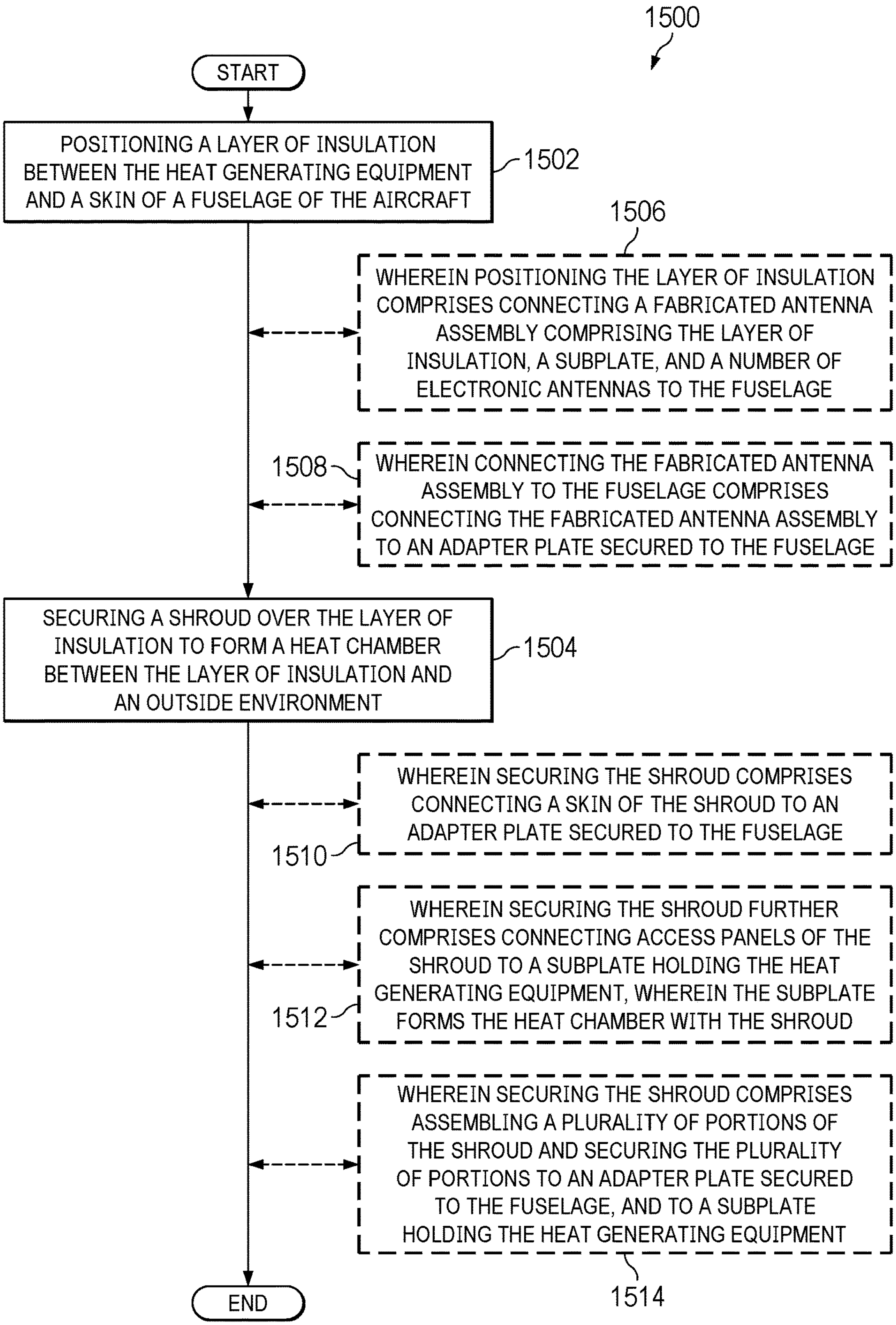
FIG. 15 is a flowchart of a method of attaching heat generating equipment to an exterior of an aircraft in accordance with an illustrative embodiment.

Turning now to FIG. 15, a flowchart of a method of attaching heat generating equipment to an exterior of an aircraft is depicted in accordance with an illustrative embodiment. Method 1500 can be performed to attach mounting system 120 to aircraft 100 of FIG. 1. Method 1500 can be performed to attach mounting system 202 to aircraft 200 of FIG. 2. Method 1500 can be performed using mounting system 301 of FIG. 3. Method 1500 can be performed using mounting system 401 of FIGS. 4-8. Method 1500 can be performed using mounting system 901 of FIG. 9.

Method 1500 positions a layer of insulation between the heat generating equipment and a skin of a fuselage of the aircraft (operation 1502). Method 1500 secures a shroud over the layer of insulation to form a heat chamber between the layer of insulation and an outside environment (operation 1504). Afterwards, method 1500 terminates.

In some illustrative examples, positioning the layer of insulation comprises connecting a fabricated antenna assembly comprising the layer of insulation, a subplate, and a number of electronic antennas to the fuselage (operation 1506). In these illustrative examples, the fabricated antenna assembly can be assembled offline. Assembling the fabricated antenna assembly offline can reduce the time and resources used during assembly on the aircraft. In some illustrative examples, connecting the fabricated antenna assembly to the fuselage comprises connecting the fabricated antenna assembly to an adapter plate secured to the fuselage (operation 1508). In some illustrative examples, the adapter plate is already secured to the fuselage of an aircraft in service. In these illustrative examples, the fabricated antenna assembly can be connected to the adapter plate as part of a retrofit. In other illustrative examples, the fabricated antenna assembly can be connected to the adapter plate during manufacturing of the aircraft In some illustrative examples, securing the shroud comprises connecting a skin of the shroud to an adapter plate secured to the fuselage (operation 1510). In some illustrative examples, securing the shroud further comprises connecting access panels of the shroud to a subplate holding the heat generating equipment, wherein the subplate forms the heat chamber with the shroud (operation 1512). In these illustrative examples, the shroud comprises a plurality of pieces. In some illustrative examples, securing the shroud comprises assembling a plurality of portions of the shroud and securing the plurality of portions to an adapter plate secured to the fuselage, and to a subplate holding the heat generating equipment (operation 1514).

Figure 16:
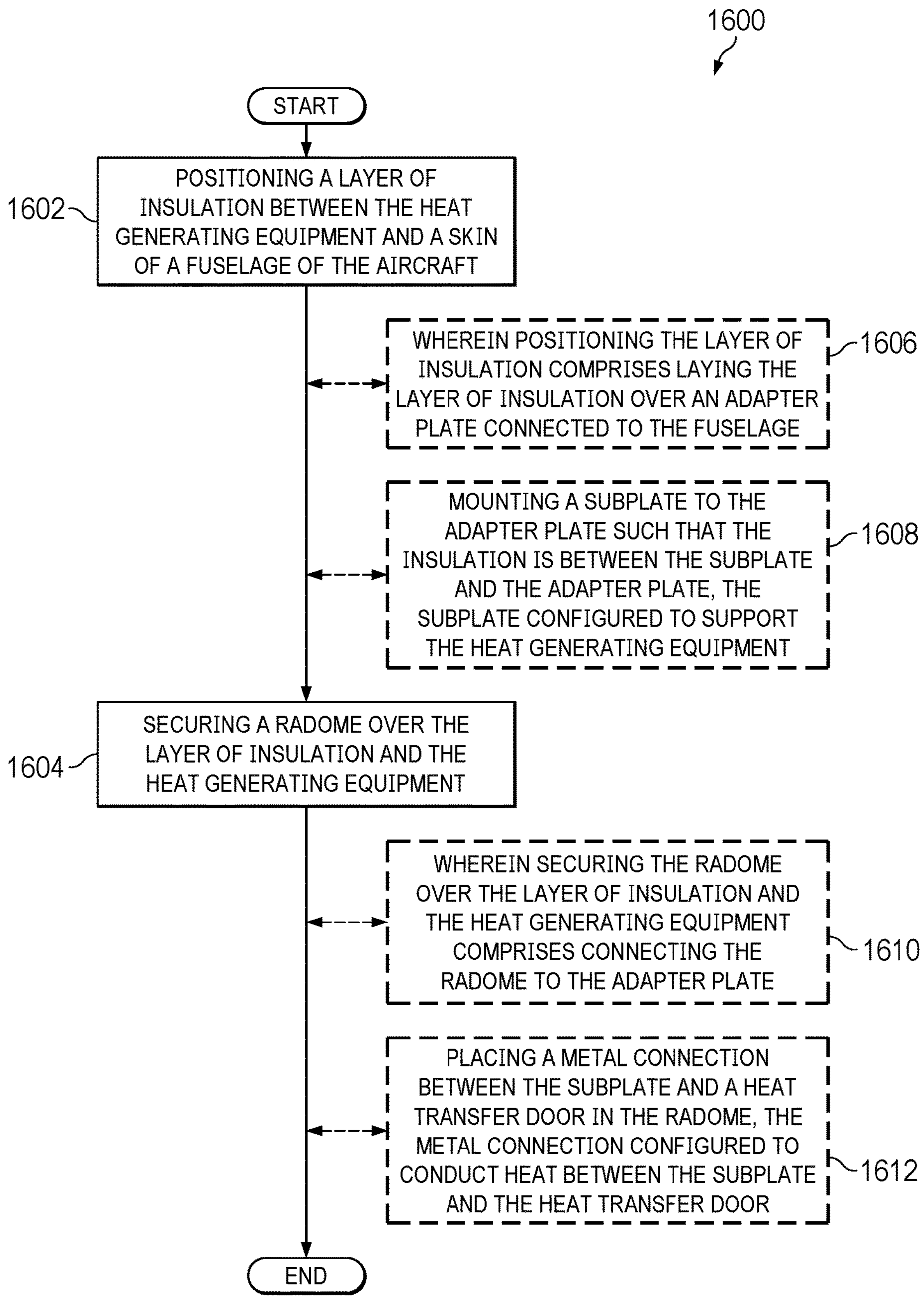
FIG. 16 is a flowchart of a method of attaching heat generating equipment to an exterior of an aircraft in accordance with an illustrative embodiment.

Turning now to FIG. 16, a flowchart of a method of attaching heat generating equipment to an exterior of an aircraft is depicted in accordance with an illustrative embodiment. Method 1600 can be performed to attach mounting system 120 to aircraft 100 of FIG. 1. Method 1600 can be performed to attach mounting system 1002 to aircraft 1000 of FIG. 10. Method 1600 can be performed using mounting system 1100 of FIGS. 11-12. Method 1600 can be performed using components of mounting system 1100 depicted in view 1300 of FIG. 13. Method 1600 can be performed using mounting system 1100 depicted in view 1400 of FIG. 14.

Method 1600 positions a layer of insulation between the heat generating equipment and a skin of a fuselage of the aircraft (operation 1602). Method 1600 secures a radome over the layer of insulation and the heat generating equipment (operation 1604).

In some illustrative examples, positioning the layer of insulation comprises laying the layer of insulation over an adapter plate connected to the fuselage (operation 1606). The layer of insulation is configured to cover a first face of the adapter plate to reduce or eliminate heat transferred to adapter plate.

In some illustrative examples, method 1600 mounts a subplate to the adapter plate such that the layer of insulation is between the subplate and the adapter plate, wherein the subplate is configured to support the heat generating equipment (operation 1608). In some illustrative examples, the subplate is a generic subplate configured to receive a plurality of different types of heat generating equipment. In some illustrative examples, the subplate is a unitary metal structure.

In some illustrative examples, securing the radome over the layer of insulation and the heat generating equipment comprises connecting the radome to the adapter plate (operation 1610). In some illustrative examples, the adapter plate is present on an aircraft that is already in service. In these illustrative examples, the radome can be secured as part of a retrofit. In some illustrative examples, the adapter plate is connected to the aircraft in order to receive the radome as part of an initial manufacturing of the aircraft.

In some illustrative examples, method 1600 places a metal connection the subplate and a heat transfer door in the radome, wherein the metal connection is configured to conduct heat between the subplate and the heat transfer door (operation 1612).

Figure 17:
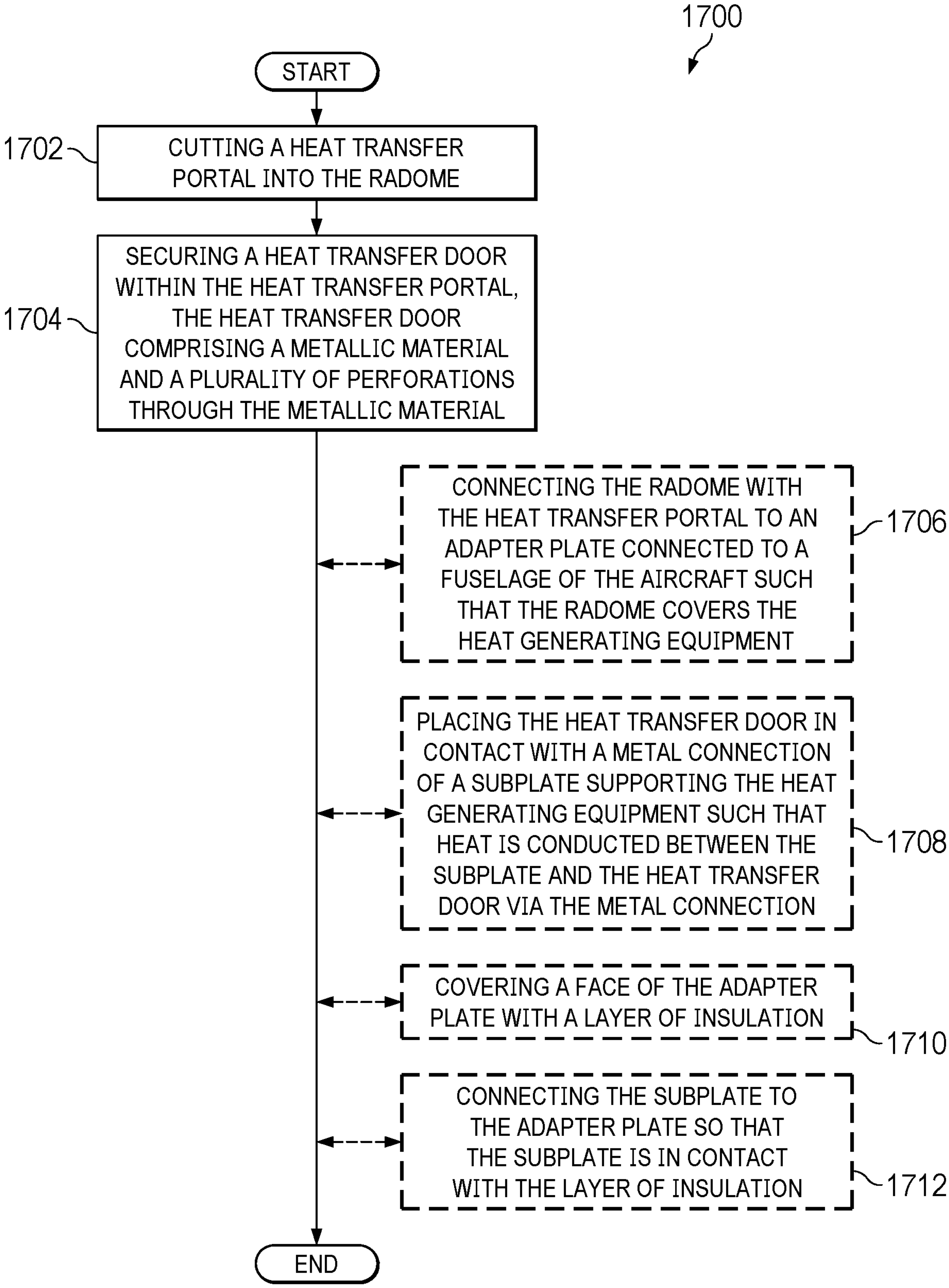
FIG. 17 is a flowchart of a method of retrofitting a radome for covering heat generating equipment on an aircraft in accordance with an illustrative embodiment.

Turning now to FIG. 17, a flowchart of a method of retrofitting a radome for covering heat generating equipment on an aircraft is depicted in accordance with an illustrative embodiment. Method 1700 can be performed to retrofit radome 1018 of FIG. 10. Method 1700 can be used to retrofit a radome to be connected to adapter plate 1102 of FIGS. 11-12. Method 1700 can be used to retrofit radome 1302 of FIG. 13. Method 1700 can be used to retrofit radome 1402 of FIG. 14.

Method 1700 cuts a heat transfer portal into the radome (operation 1702). Method 1700 secures a heat transfer door within the heat transfer portal, wherein the heat transfer door comprises a metallic material and a plurality of perforations through the metallic material (operation 1704). Afterwards, method 1700 terminates.

In some illustrative examples, method 1700 connects the radome with the heat transfer portal to an adapter plate connected to a fuselage of the aircraft such that the radome covers the heat generating equipment (operation 1706). In some illustrative examples, method 1700 places the heat transfer door in contact with a metal connection of a subplate supporting the heat generating equipment such that heat is conducted between the subplate and the heat transfer door via the metal connection (operation 1708).

In some illustrative examples, method 1700 covers a first face of the adapter plate with a layer of insulation (operation 1710). In some illustrative examples, method 1700 connects the subplate to the adapter plate so that the subplate is in contact with the layer of insulation (operation 1712).

As used herein, the phrase "at least one of," when used with a list of items, means different combinations of one or more of the listed items may be used and only one of each item in the list may be needed. For example, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, two of item A; one of item B; and ten of item C; four of item B and seven of item C; or other suitable combinations. The item may be a particular object, thing, or a category. In other words, at least one of means any combination items and number of items may be used from the list but not all of the items in the list are required.

As used herein, "a number of," when used with reference to items means one or more items.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram. Some blocks may be optional. For example, operation 1506 through operation 1514 may be optional. As another example, operation 1606 through operation 1612 may be optional. As another example, operation 1706 through operation 1712 may be optional.

Figure 18:
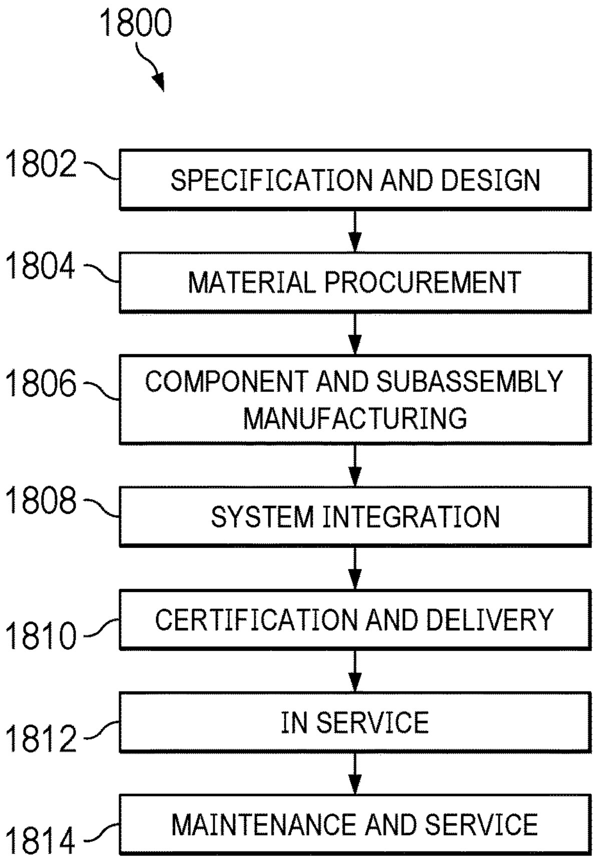
FIG. 18 is an illustration of an aircraft manufacturing and service method in a form of a block diagram in accordance with an illustrative embodiment.
Figure 19:
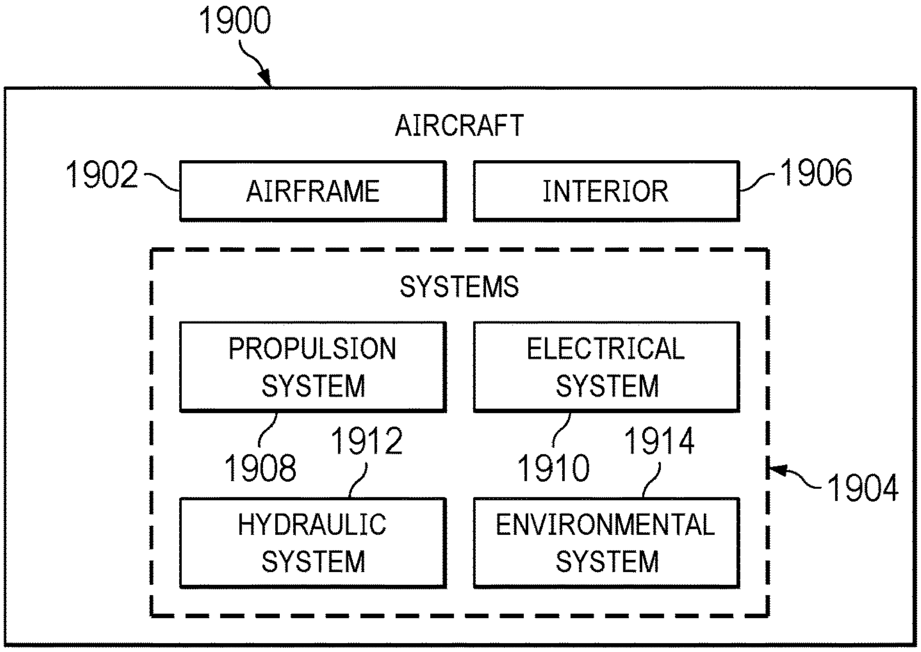
FIG. 19 is an illustration of an aircraft in a form of a block diagram in which an illustrative embodiment may be implemented.

Illustrative embodiments of the present disclosure may be described in the context of aircraft manufacturing and service method 1800 as shown in FIG. 18 and aircraft 1900 as shown in FIG. 19. Turning first to FIG. 18, an illustration of an aircraft manufacturing and service method in a form of a block diagram is depicted in accordance with an illustrative embodiment. During pre-production, aircraft manufacturing and service method 1800 may include specification and design 1802 of aircraft 1900 in FIG. 19 and material procurement 1804.

During production, component and subassembly manufacturing 1806 and system integration 1808 of aircraft 1900 takes place. Thereafter, aircraft 1900 may go through certification and delivery 1810 in order to be placed in service 1812. While in service 1812 by a customer, aircraft 1900 is scheduled for routine maintenance and service 1814, which may include modification, reconfiguration, refurbishment, or other maintenance and service.

Each of the processes of aircraft manufacturing and service method 1800 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 19, an illustration of an aircraft in a form of a block diagram is depicted in which an illustrative embodiment may be implemented. In this example, aircraft 1900 is produced by aircraft manufacturing and service method 1800 of FIG. 18 and may include airframe 1902 with plurality of systems 1904 and interior 1906. Examples of systems 1904 include one or more of propulsion system 1908, electrical system 1910, hydraulic system 1912, and environmental system 1914. Any number of other systems may be included.

Apparatuses and methods embodied herein may be employed during at least one of the stages of aircraft manufacturing and service method 1800. One or more illustrative embodiments may be manufactured or used during at least one of component and subassembly manufacturing 1806, system integration 1808, in service 1812, or maintenance and service 1814 of FIG. 18.

The illustrative examples provide the ability to install a new antenna technology into existing airplane structure in production and retrofit. The illustrative examples also allow for management of the heat of the new electronic antenna technologies. New electronic antenna technologies can get hotter than the fuselage skin can accept if the antennas were to be installed directly on top of the skin.

The illustrative examples provide mounting systems with a smaller protrusion than traditional radomes. The illustrative examples provide mounting systems that are shorter than conventional radomes.

The illustrative examples provide protection against overheating of an aircraft skin. The illustrative examples provide thermal protection even if hardware thermal shutdown protections do not trigger.

Electronically steered antennas are expected to produce excessive amounts of heat, which may increase the temperature of the aircraft skin to undesirably high levels is secured directly. The illustrative examples establish a new method to direct excess heat from the base of very hot electronically steered antennas (ESA) up and out to the atmosphere through a subplate and shroud radiator. Insulation below Esa protects aircraft fuselage skin.

The shroud is a low profile and aerodynamically advantageous design. Due to the aerodynamics, the shroud leads to lower levels of aerodynamic drag, compared to a conventional radome. The illustrative examples provide protection from bird strike impacts. The shroud provides lightning strike protection, due to the large and continuous ground path. The integrated nature of the subplate and its attach fittings will permit off-site installation of antennas, associated line repair units (LRUs), wire harnesses, grounding straps into a single assembly for delivery to the final assembly line. Reduced effort is used to bolt an integrated subplate and ESA assembly in comparison to assembling completely on the assembly line. Decentralized manufacturing with offsite installation will produce large time and cost savings, compared to the very long installation times required for today's mechanically steered antennas.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A mounting system for attaching heat generating equipment to an exterior of an aircraft, the mounting system comprising:

an adapter plate configured to be connected to a fuselage of an aircraft;

a layer of insulation substantially covering a first face of the adapter plate;

a subplate formed of a conductive material and connected to the adapter plate such that the layer of insulation is positioned between the subplate and the adapter plate;

heat generating equipment secured within the subplate;

a radome connected to the adapter plate and positioned to cover the heat generating equipment and the subplate; and a connector formed of a conductive material and connected only between the subplate and the radome.

2. The mounting system of claim 1, wherein the radome is formed of a conductive material.

3. The mounting system of claim 1, wherein the subplate is a unitary metal structure.

4. The mounting system of claim 1, wherein the heat generating equipment comprises a number of electronic antennas.

5. The mounting system of claim 1, wherein the radome is formed of a composite material.

6. The mounting system of claim 1, further comprising:
a heat transfer portal cut into the radome.

7. The mounting system of claim 6, further comprising:
a heat transfer door positioned within the heat transfer portal.

8. The mounting system of claim 7, wherein the heat transfer door comprises a metallic material with a plurality of perforations in the metallic material.

9. The mounting system of claim 8, wherein the perforations take the form of one of a matrix of holes, a plurality of slots, or a plurality of overlapping louvers.

10. The mounting system of claim 8, wherein the heat transfer door comprises shape memory alloy actuators.

11. The mounting system of claim 7,
wherein the connector is formed from metal, and
wherein the connector is configured to conduct heat between the subplate and the heat transfer door.

12. A method of using the mounting system of claim 1 for attaching heat generating equipment to an exterior of an aircraft, the method comprising:
positioning the layer of insulation between the heat generating equipment and a skin of the fuselage of the aircraft; and
securing the radome over the layer of insulation and the heat generating equipment.

13. The method of claim 12, wherein said positioning the layer of insulation comprises laying the layer of insulation over the adapter plate connected to the fuselage.

14. The method of claim 13, further comprising:
mounting the subplate to the adapter plate such that the layer of insulation is between the subplate and the adapter plate, wherein the subplate is configured to support the heat generating equipment.

15. The method of claim 14, wherein said securing the radome over the layer of insulation and the heat generating equipment comprises connecting the radome to the adapter plate.

16. The method of claim 15, wherein the connector formed of conductive material is a metal connection, the method further comprising:
placing the metal connection between the subplate and a heat transfer door in the radome, wherein the metal connection is configured to conduct heat between the subplate and the heat transfer door.

17. A method of using the mounting system of claim 1 for retrofitting the radome for covering heat generating equipment on an aircraft, the method comprising:
cutting a heat transfer portal into the radome; and
securing a heat transfer door within the heat transfer portal, wherein the heat transfer door comprises a metallic material and a plurality of perforations through the metallic material.

18. The method of claim 17, further comprising:
connecting the radome with the heat transfer portal to the adapter plate connected to the fuselage of the aircraft such that the radome covers the heat generating equipment.

19. The method of claim 18, wherein the connector formed of conductive material is a metal connection, the method further comprising:
placing the heat transfer door in contact with the metal connection of the subplate supporting the heat generating equipment such that heat is conducted between the subplate and the heat transfer door via the metal connection.

20. The method of claim 19, further comprising:
covering a first face of the adapter plate with the layer of insulation; and
connecting the subplate to the adapter plate so that the subplate is in contact with the layer of insulation.

* * * * *